United States Patent
Watanabe et al.

(10) Patent No.: US 6,310,383 B1
(45) Date of Patent: Oct. 30, 2001

(54) THERMOELECTRIC ELEMENT AND METHOD FOR MANUFACTURING THE SAME

(75) Inventors: Shigeru Watanabe, Iruma; Yumiko Sakamaki, Sayama, both of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/269,199

(22) PCT Filed: Aug. 3, 1998

(86) PCT No.: PCT/JP98/03447

§ 371 Date: Mar. 30, 1999

§ 102(e) Date: Mar. 30, 1999

(87) PCT Pub. No.: WO99/07024

PCT Pub. Date: Feb. 11, 1999

(30) Foreign Application Priority Data

Aug. 1, 1997 (JP) ................................. 9-207461

(51) Int. Cl.[7] ............................................ H01L 23/38
(52) U.S. Cl. ..................... 257/470; 257/654; 136/203; 136/204; 136/212
(58) Field of Search .................... 257/467, 930; 136/203, 204, 212

(56) References Cited

U.S. PATENT DOCUMENTS

| | | |
|---|---|---|
| 3,780,425 | 12/1973 | Penn et al. ............................. 29/573 |
| 4,149,025 | * 4/1979 | Niculescu ............................. 136/206 |

FOREIGN PATENT DOCUMENTS

| | | |
|---|---|---|
| 209 545 | 5/1984 | (DD) . |
| 1539309 | 3/1970 | (DE) . |
| 0506093A1 | 9/1992 | (EP) . |
| 0687020A1 | 12/1995 | (EP) . |
| 0773592A2 | 5/1997 | (EP) . |
| 63-20880 | 1/1988 | (JP) . |
| 63-20881 | 1/1988 | (JP) . |
| 63-70462 | 3/1988 | (JP) . |
| 63-70463 | 3/1988 | (JP) . |
| 63-76386 | 4/1988 | (JP) . |
| 63-110779 | 5/1988 | (JP) . |
| 5-335630 | 12/1993 | (JP) . |
| 8-18109 | 1/1996 | (JP) . |

OTHER PUBLICATIONS

European Search Report dated Nov. 4, 1999.

* cited by examiner

*Primary Examiner*—Olik Chaudhuri
*Assistant Examiner*—Wai-Sing Louie
(74) *Attorney, Agent, or Firm*—Armstrong, Westerman, Hattori, McLeland & Naughton LLP

(57) ABSTRACT

A plurality of n-type bar-shaped devices (51) consisting of an n-type thermoelectric semiconductor and a plurality of p-type bar-shaped devices (52) consisting of a p-type thermoelectric semiconductor are regularly disposed or fixed through an insulating layer (50) to form a thermoelectric device block (53). End portions of the n-type bar shaped device (51) and the p-type bar-shaped device (52) are connected with an interconnection conductor (58*a*) on an upper surface (53*a*) and a lower surface (53*b*), which will be interconnecting end faces of the thermoelectric device block (53), to form a plurality of thermocouples connected in series. In addition, a pair of terminal conductors (58*b*, 58*b*) which is electrically connected with bar-shaped devices (51*a*, 52*a*) at least on one end portion and the other end portion of the n-type and p-type bar-shaped devices (51, 52) connected in series is formed on end face (53*c*) excluding the upper surface (53*a*) and the lower surface (53*b*) which will be an interconnecting end face of the thermoelectric device block (53), and a lead wire is connected to the terminal conductors (58*b*, 58*b*).

1 Claim, 15 Drawing Sheets

THERMOELECTRIC ELEMENT AND METHOD FOR MANUFACTURING THE SAME

TECHNICAL FIELD

This invention relates to a structure of a thermoelectric device and a method of fabricating the thermoelectric device, and more particularly, a structure of a pad for a lead line to connect a thermoelectric device to another circuit, and a method of fabrication thereof.

BACKGROUND TECHNOLOGY

Various metal materials have been used for electric parts, and micronization of the electric parts is being developed every year. A typical example is a thermoelectric device. In the thermoelectric device, a voltage is generated by providing a difference in temperature between the opposite ends thereof. A device designed to extract the voltage as electric energy is a thermoelectric power generator. Such a thermoelectric device wherein heat energy can be converted directly into electric energy has attracted much attention as an effective means of utilizing heat energy, as represented by the case of waste heat utilization.

Meanwhile, the flow of a current caused to occur through the thermoelectric device results in generation of heat at one end thereof, and absorption of heat at the other end thereof. This is due to the Peltier effect, and a cooler can be manufactured by taking advantage of such a phenomenon of heat absorption. This type of cooler which does not comprise mechanical components and can be reduced in size has an application as a portable refrigerator, or a localized cooler for lasers, integrated circuits, and the like.

The thermoelectric device which is used as a thermoelectric power generator or cooler is simple in construction, and is in a more favorable condition for miniaturization as compared with other types of power generators, and there will not arise a problem of leakage or depletion of electrolyte as with the case of a redox cell. Therefore, the thermoelectric device has promising prospects for application to portable electronic devices such as an electronic wrist watch.

The thermoelectric device is formed with plural thermocouples consisting of p-type and n-type thermoelectric semiconductors, aligned in series.

In the case of the difference in temperature between a cold junction and a hot junction of the thermoelectric device is 1.3° C., in order to obtain voltage of more than 1.5 V which is necessary for driving the wrist watch, more than 2000 pairs of thermocouples are required even with BiTe-based thermocouples which are said to have a high performance index.

The thermoelectric device is required to be as small in size as possible, because it is disposed in a highly-limited space such as the interior of a wrist watch. Therefore, a highly-dense and minute thermoelectric device in size is required so that many thermocouples can be arranged in a limited area.

For example, Japanese Patent Laid-open No. 63-20880 discloses a method of fabrication of a miniaturized thermoelectric device with a plurality of thermocouples in high density.

In this publication, mentioned is a method of fabrication to form a p-type bar-shaped device and an n-type bar-shaped device in a manner such that the p-type and n-type thermoelectric materials in a thin sheet-like shape are laminated on top of each other in layers while interposing a heat insulating material between respective p-type and n-type thermoelectric material layers, and grooves are formed at fixed intervals in a perpendicular direction to a laminated surface. The p-type bar-shaped device and the n-type bar-shaped device are connected in series with electrode materials at each end.

The thermoelectric device formed with the above-described method has a size of 30×20×3.5 (mm), containing 3500 pairs of thermocouples, which amounts to 7000 pieces of the total of the bar-shaped devices in an extremely high density.

However, in the case of connecting another circuit to this thermoelectric device, current must be taken out from one of the electric patterns shown here. When ordinary solder is used to take out the lead line for this purpose, it needs very fine work and a special device. In addition, formation of a large electrode for the lead line requires a large thermoelectric device itself, which is inconvenient to dispose in a limited space.

It is an object of the present invention to solve the above-described disadvantages and to provide a structure of the thermoelectric device which takes out a lead line easily and efficiently while having a fine and high-density structure, and a method of fabrication thereof.

DISCLOSURE OF THE INVENTION

In order to achieve the above described objects, the present invention adopts a structure explained hereinafter in the thermoelectric device and the method of fabrication thereof.

The thermoelectric device of the present invention comprises a thermoelectric device block having two interconnecting end faces on which a plurality of n-type bar-shaped devices consisting of n-type thermoelectric semiconductors and a plurality of p-type thermoelectric devices consisting of p-type thermoelectric semiconductors are regularly disposed through an insulating layer and fixed, and both end faces of each of said n-type bar-shaped devices and p-type bar-shaped devices are exposed, an interconnection conductor connecting each end face of said n-type bar-shaped device and p-type bar-shaped device on said each interconnecting end face of said thermoelectric device block to connect said n-type bar-shaped devices and p-type bar-shaped devices in series, a pair of terminal conductors provided on a surface excluding said interconnecting end face of said thermoelectric device block, and electrically connected each bar-shaped device at least on one end portion and the other end portion of the n-type bar-shaped device and p-type bar-shaped device connected in series.

At this time, the bar-shaped devices at least on one end portion and the other end portion of the n-type and p-type bar-shaped devices connected in series may be exposed on one surface excluding the interconnecting end face of the above described thermoelectric device block, and respective one and the other of said pair of terminal conductors are may be made contact with and provided on the exposed surface of each bar-shaped device.

Alternatively, each bar-shaped device on the above-described one end portion and the other end portion can be exposed to one surface and the other surface of opposing two surfaces excluding the interconnecting end faces, and one and the other of the above-described pair of terminal conductors can be provided in contact with the exposed surfaces of the above described one surface and the other surface of each bar-shaped device to form the thermoelectric device.

Furthermore, it is also acceptable to make a thermoelectric device in a manner such that each bar-shaped device provided on at least one end portion and the other end portion of the n-type and p-type bar-shaped devices connected in series is exposed respectively to the chamfered oblique surface formed between one surface excluding the interconnecting end surface and the adjacent surface, and one and the other terminal conductors are respectively provided in contact with the exposed surface of the chamfered oblique surface and the exposed surface of the other chamfered oblique surface of each above-described bar-shaped device.

Alternatively, it is also possible to make a thermoelectric device in a manner such that the above-described thermoelectric device block has a plurality of device lines in which the n-type bar-shaped devices and the p-type bar-shaped devices align alternately, and consists of a first interconnection conductor connecting each end face of adjacent n-type and p-type bar-shaped devices, which are contained in the same device line among the plural device lines in a parallel direction to the device line, a second interconnection conductor connecting each end face of n-type and p-type bar-shaped devices spreading across the adjacent device line, and a pair of third interconnection conductor connected to each end face of each bar-shaped device provided at least on one end portion and the other portion of n-type and p-type bar-shaped devices connected in series with the first and second interconnection conductors, and a pair of the terminal conductors connect to the third interconnection conductors respectively.

Furthermore, a thermoelectric device can be structured in a manner such that while a plurality of the similar device line to that described above are provided, the thermoelectric device is provided with similar first and second interconnection conductors to those described above, and a pair of third interconnection conductors connected to each end face of the first bar-shaped device group containing the bar-shaped devices at least on one end portion of the n-type and p-type bar-shaped devices connected in series with the first and second interconnection conductors and each end face of the second bar-shaped device group containing the bar-shaped devices on the other end portion thereof respectively, and the bar-shaped device of the first bar-shaped device group and the bar-shaped device of the second bar-shaped device group are exposed on a surface excluding the above-described interconnecting end face of the above-described thermoelectric device block, and a pair of the terminal conductors connect to an exposed surfaces of the bar-shaped devices of the above described respective groups.

In this thermoelectric device, each bar-shaped device provided on one end portion and the other end portion of the n-type and p-type bar-shaped devices connected in series may be located near the diagonal position in relation to the interconnecting end face of the thermoelectric device block.

Furthermore, these thermoelectric devices can be structured in a manner such that a pair of terminal conductors are formed on one surface except the interconnecting end face of the thermoelectric device block, or formed one each on the opposing two surfaces excluding the interconnecting end face of the thermoelectric device block.

In addition to the above, the present invention characterized in the method of fabrication of the thermoelectric device which includes a step of forming a block of the thermoelectric devices, a step of forming a plurality of thermocouples by connecting each end face of n-type and p-type bar-shaped devices on the interconnecting end face with an interconnection conductor in a manner such that a plurality of n-type and p-type bar-shaped devices are connected in series alternately, and a step of forming a pair of terminal conductors electrically connected respectively with bar-shaped devices provided at least on one end portion and the other end portion of plural thermocouples connected in series on a surface excluding the interconnecting end faces.

In this method of fabrication, a terminal conductor may be formed on one surface excluding the interconnecting end face, or on two surfaces opposite to each other.

Alternatively, the method may have a step of exposing on a surface excluding the interconnecting end surface, each bar-shaped device provided at least on one end portion and the other end portion of the plural thermocouples connected in series before forming the terminal conductor, to form by bringing one and the other of a pair of the terminal conductors to contact with one and the other exposed surface of each bar-shaped device.

In this case, the formation can be carried out by exposing each bar-shaped device on two opposite surfaces excluding the interconnecting end face, and by contacting one and the other of a pair of terminal conductors with each one and the other exposed surface of each bar-shaped device.

The thermoelectric device can be structured with a step of forming each chamfered oblique surface by cutting or grinding corner portions formed with a surface excluding the interconnecting end face and each surface adjacent to both ends of the surface thereof and exposing bar-shaped devices provided at least on one end and the other end of plural thermocouples connected in series on one and the other chamfered oblique surfaces, and a step of respectively contacting one and the other of a pair of terminal conductors with each bar-shaped device on the exposed surfaces of chamfered oblique surfaces.

In each above-described method of fabrication, steps of forming the thermoelectric device block can include a step of forming a longitudinal groove and a longitudinal partition wall on an n-type thermoelectric semiconductor block and a p-type thermoelectric semiconductor block to make an n-type grooved block and a p-type grooved block, a step of forming an integrated block by combining the longitudinal groove and the longitudinal partition wall inserted into each other to unite the n-type grooved block and the p-type grooved block, and by forming a insulating adhesive layer in a space between the inserting portions of both blocks, a step of making an integrated grooved wall block with by forming a transverse groove and a transverse partition in a direction intersecting with the above-described transverse groove on the integrated block, a step of forming a block by forming an insulating layer on the transverse groove of the integrated grooved wall block so that a block can be formed on which the plural n-type bar-shaped devices and the plural p-type bar-shaped devices are regularly arranged through the insulating layer, and a step of forming two interconnecting end faces by cutting or grinding two surfaces intersecting with the longitudinal direction of the n-type bar-shaped device and the p-type bar-shaped device of the block to expose both end faces of aforementioned each n-type bar-shaped device and each p-type bar-shaped device.

In the present invention, a lead line is pulled out from a surface excluding the interconnecting end surfaces which connects each end face of the bar-shaped devices in the thermoelectric device. Accordingly, no space is required for providing a lead line, which gives the thermoelectric device better space efficiency. It is effective for a small size thermoelectric device.

Even in the case of a highly dense device, a space for a lead line can be provided with a certain measure of width irrespective of the fine interconnection electrode pattern. Therefore workability is good and a reliable electric contact is given.

BEST MODE FOR CARRYING OUT THE INVENTION

Hereinafter, a structure of a thermoelectric device and a method of fabrication of the same will be explained with reference to the drawings.

Figure 8:
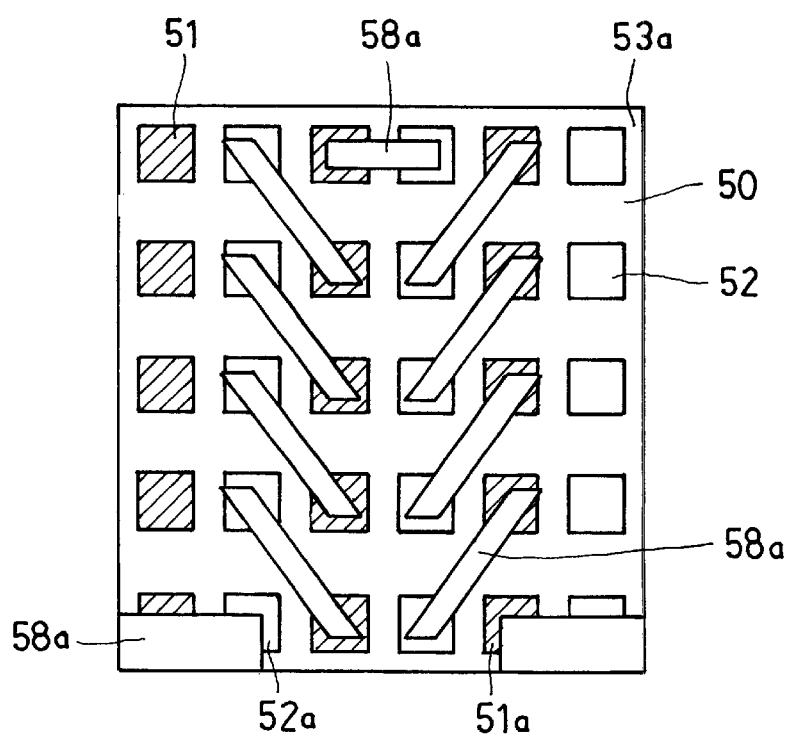
FIG. 8 is a plan view of a thermoelectric device on which an interconnection pattern is formed.
Figure 9:
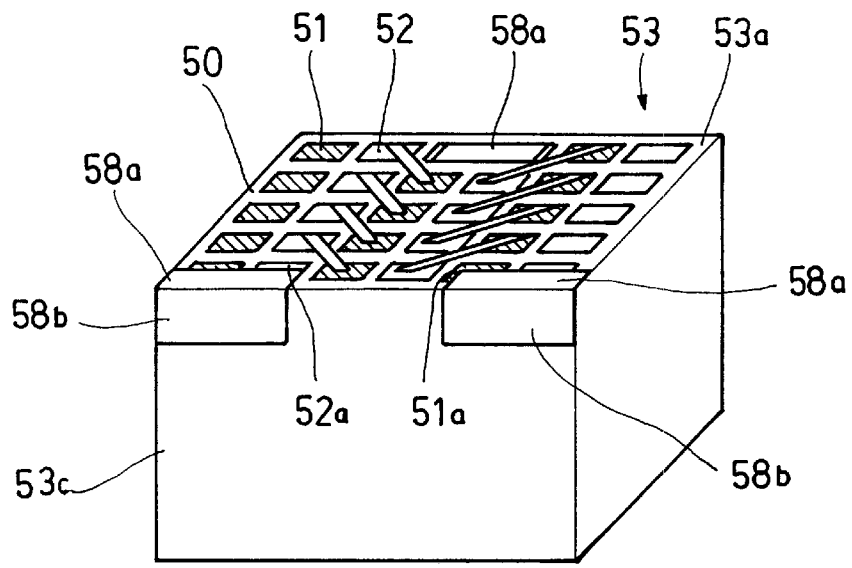
FIG. 9 is a perspective view of the same.
Figure 10:
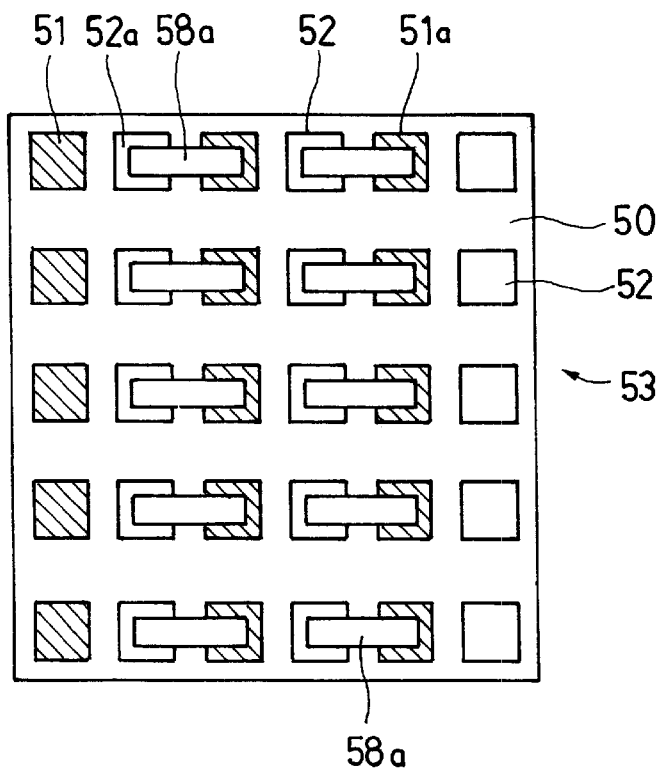
FIG. 10 is a back view of the same.

First Embodiment of the Structure of Thermoelectric Device: FIG. 8 to FIG. 10

First, the structure of the thermoelectric device according to the present invention will be explained.

As shown in FIG. 9, the thermoelectric device of the present invention is structured mainly with a thermoelectric device block 53 and a conductor 58 formed on the surface thereof.

The thermoelectric device block 53 is structured as shown in the drawing in a manner such that an n-type bar-shaped device 51 in which an n-type thermoelectric semiconductor is processed into a square column and a p-type bar-shaped device 52 in which a p-type thermoelectric semiconductor is similarly processed, are arranged regularly and fixed to integrate with each other into a cuboid like shape.

The thermoelectric device block 53 contains an insulating layer 50 made of an insulating resin to insulate the n-type bar-shaped device 51 and the p-type bar-shaped devices 52, among each of the n-type bar-shaped devices 51, and among each of the p-type bar-shaped devices 52 respectively, and to fix the n-type bar-shaped device 51 and the p-type bar-shaped device 52.

The thermoelectric device block 53 has an upper surface 53a and a lower surface 53b as two interconnecting end faces which are made by exposing both end faces of the n-type bar-shaped device 51 and the p-type bar-shaped device 52, and has one of a surface excluding the interconnecting end faces as a side surface 53c.

A conductor 58 consists of plural interconnection conductors 58a to connect respective end faces of the n-type bar-shaped device 51 and the p-type bar-shaped device 52 on the upper surface 53a and the lower surface 53b, and terminal conductors 58b provided on the side surface 53c.

The interconnection conductor 58a is structured on the upper surface 53a and the lower surface 53b in an arrangement shown in FIG. 8 and FIG. 10, respectively. Each end face of the n-type bar-shaped device 51 and the p-type bar-shaped device 52 is connected with the interconnection conductor 58a to form a series of thermocouples in which a plurality of n-type bar-shaped devices 51 and p-type bar-shaped devices 52 are connected respectively in series so that as many as possible thermocouples can be formed.

The terminal conductors 58b are formed in a pair on a side surface 53c of the thermoelectric device block 53, as shown in FIG. 9, and each terminal conductor 58b is electrically connected to the bar-shaped devices containing each of bar-shaped devices 51a, 52a provided on one end portion and the other end portion of a series of the n-type and p-type bar-shaped devices connected in series. Each terminal conductor 58b is also electrically connected to the interconnection conductors 58a. The terminal conductor 58b serves as a pad for a lead line, to which another lead wire can be connected with solder or a conductive adhesive agent. The lead wire is used for connecting to another devices or circuits.

First Embodiment of a Method of Fabricating the Thermoelectric Device: FIG. 1 to FIG. 10

Next, a method of fabricating the thermoelectric device of the present invention will be explained.

Figure 1:
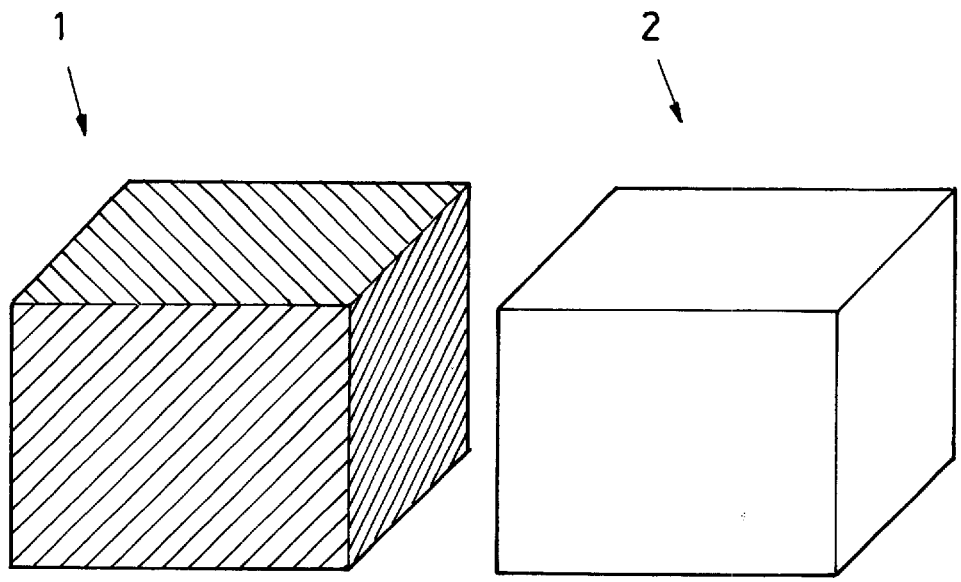
FIG. 1 is a perspective view showing an example of an n-type and p-type thermoelectric semiconductor blocks of the present invention.

First, as shown in FIG. 1, an n-type thermoelectric semiconductor block 1 and a p-type thermoelectric semiconductor block 2 are prepared. The n-type thermoelectric block 1 and the p-type thermoelectric semiconductor block 2 are semiconductor blocks which will be square-column-shaped n-type and p-type bar-shaped devices respectively after processing, and it is preferable to be the same in all the sizes including length. Incidentally, in the drawings, diagonals are provided to the n-type thermoelectric semiconductor block 1 to make both blocks easily distinguishable.

In this embodiment, an n-type BiTe sintered body, that is an n-type thermoelectric semiconductor, is used for the n-type thermoelectric semiconductor block 1 and a p-type BiTeSb sintered body, that is a p-type thermoelectric semiconductor, is used for the p-type thermoelectric semiconductor block 2, the dimensions of the both blocks being set at 12 mm×12 mm×4 mm.

Figure 2:
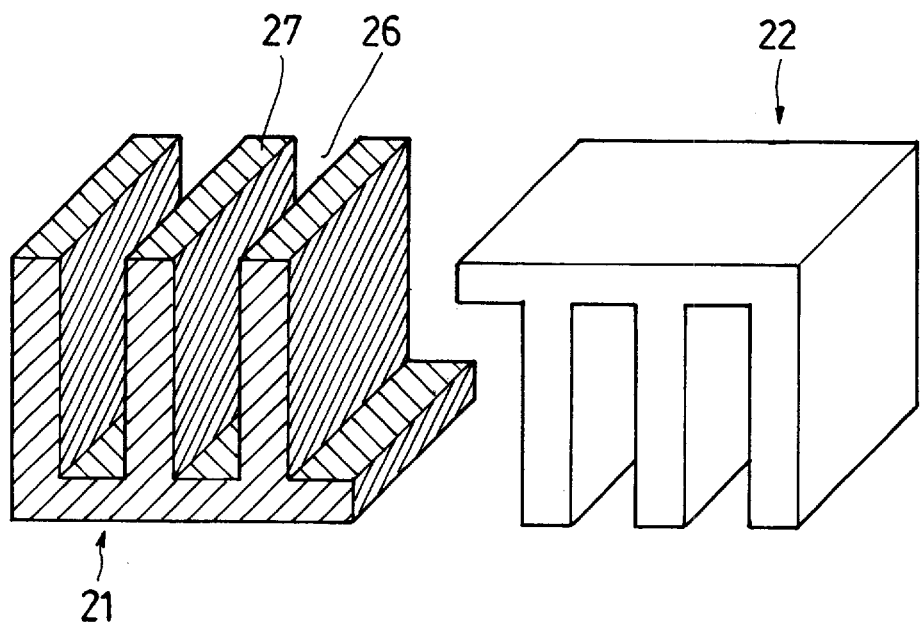
FIG. 2 is a perspective view showing an example of n-type and p-type grooved blocks.

Then, as shown in FIG. 2, a plural number of longitudinal grooves 26 are formed in parallel at fixed pitches on the n-type thermoelectric semiconductor block 1, and a longitudinal partition wall 27 is formed at the same time to form a comb-tooth n-type grooved block 21. Similarly, a p-type grooved block 22 is formed from the p-type thermoelectric semiconductor block 2. At this time, the longitudinal grooves 26 of the n-type grooved block 21 and the p-type grooved block 22 are made the same in pitch, and the width of the longitudinal groove 26 on one block is made larger than the width of the other longitudinal partition wall 27.

The width of the longitudinal groove 26 is set at a suitable value, in due consideration of fixing the n-type grooved block 21 and the p-type grooved block 22 with each other in the following process. The difference in width between the longitudinal groove 26 and the longitudinal partition wall 27 corresponds to the width of a portion which will later serve as an insulating resin layer. Considering reliable insulation between the n-type grooved block 21 and the p-type grooved block 22, and the working efficiency in the fixing process of both blocks, which will be mentioned later, the difference is preferably more than 10 $\mu$m.

Incidentally, the processing of the longitudinal groove 26 can be carried out by polishing with a wire saw.

The cross section of the wire of the wire saw is round, so strictly speaking, the shape of the bottom of the processed groove of the longitudinal groove 26 is a curved surface, but for the convenience of drawing, it is displayed in the form of a flat bottom in FIG. 2.

A longitudinal groove 26 having 3 mm in depth (the length 4 mm of the external shape is taken as a thickness direction), 120 $\mu$m in pitch, and 70 $\mu$m in width is formed using the wire saw.

Figure 3:
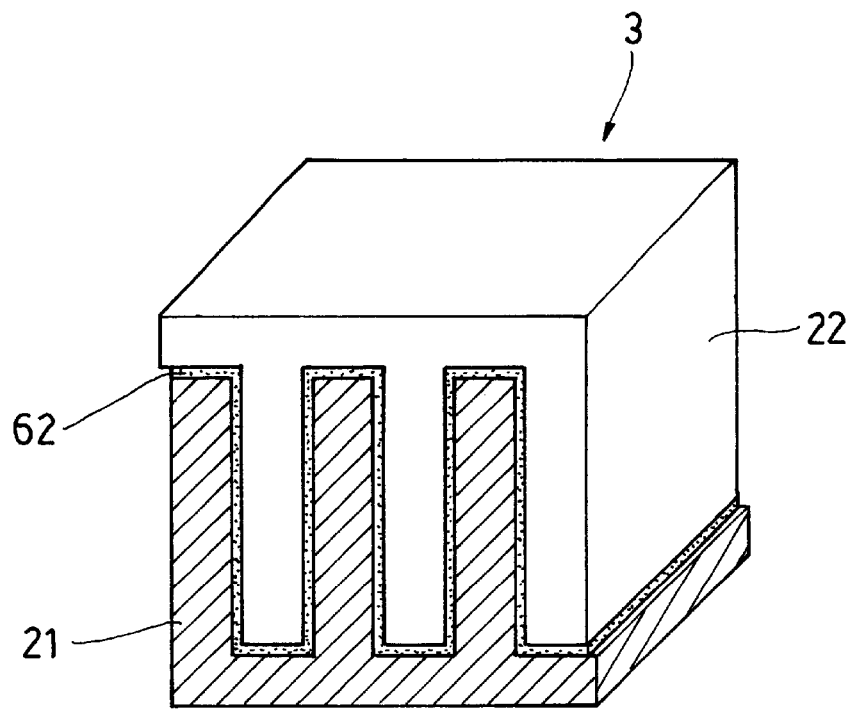
FIG. 3 is a perspective view showing an integrated state, combining the n-type and p-type grooved blocks in FIG. 2.

Next, as shown in FIG. 3, the n-type grooved block 21 and the p-type grooved block 22 shown in FIG. 2 are integrated by combining and fixing the longitudinal grooves 26 and the longitudinal partition walls 27 with each other. The combined two blocks are fixed with an insulating adhesive layer 62, having an insulating quality, provided in the space of each engaging portion to obtain an integrated block 3.

A point to be careful in an adhering process to prepare the integrated block 3 is that the adhesive layer 62 must have a function not only to adhere the two blocks but also to ensure an electrically insulating property between the n-type grooved block 21 and the p-type grooved block 22.

When the inside wall of the longitudinal groove 26 can be processed to obtain an extremely smooth surface by the polishing process with the wire saw, the integrated block 3 before bonding is partially immersed in an adhesive agent having high fluidity (for instance, low-viscosity normal temperature thermosetting type epoxy-based adhesive), and the adhesive agent is allowed to fill in the space between the longitudinal grooves 26 and the longitudinal partition walls 27 through a capillary phenomenon, thereby the electrical insulating property on the adhesive layer 62 can be ensured.

Figure 4:
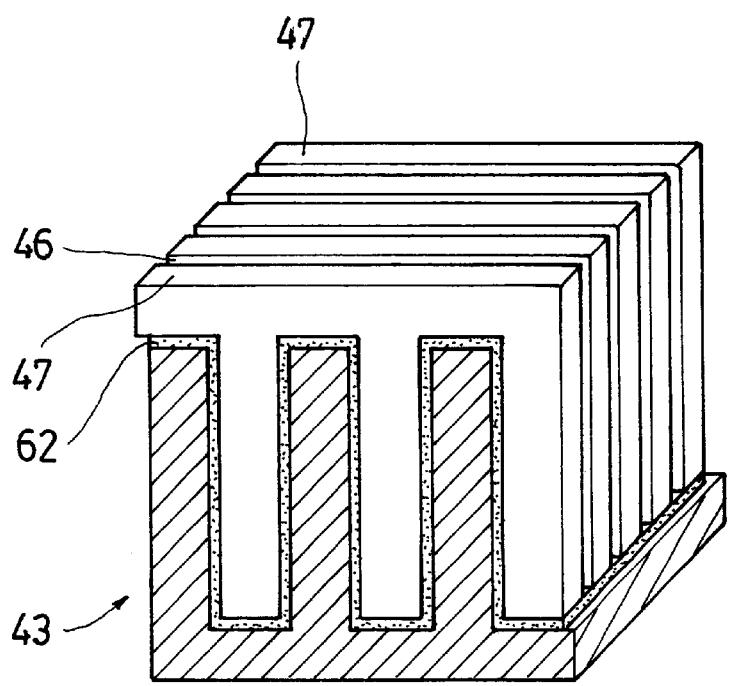
FIG. 4 is a perspective view showing an integrated grooved block in which a transverse groove is formed on the integrated block in FIG. 3.

Now, thus completed integrated block 3 in FIG. 3 is provided with a plurality of transverse grooves 46 (4 grooves in the drawing) at predetermined pitches, which are formed by another groove making process shown in FIG. 4 to complete an integrated grooved block 43.

The processing of the transverse groove 46 can be performed in a similar manner to the processing of the longitudinal grooves 26 in FIG. 2 through the polishing process with a wire saw. Then, transverse partition walls 47 are formed at predetermined intervals on a residual portion. Incidentally, the transverse grooves 46 may be formed in the direction intersecting with the longitudinal groove 26, but in general it is most suitable to form the transverse grooves 46 to intersect with the longitudinal groove 26 at right angles as shown in FIG. 4.

The transverse grooves 46 can be formed from any surface on the p-type thermoelectric semiconductor side, or, on the contrary, on the n-type thermoelectric semiconductor side. That is, the transverse grooves 46 can be formed from any of upper or lower side of the integrated block 3. The transverse groove 46 is preferably formed in a depth to the root portion of the longitudinal grooves 26 or the longitudinal partition walls 27 of the n-type thermoelectric semiconductor and the p-type thermoelectric semiconductor of the integrated block 3.

The width of the transverse groove 46 is, unlike the longitudinal groove 26, preferably to be as fine as possible. This is because, as understood from the next process, the portion to contribute to the power generation capacity is a portion of the transverse partition walls 47 and it is preferable to make the area of the transverse groove 46 as small as possible from the point in quality of the thermo electric device.

Accordingly, in this embodiment, a transverse groove 46 of 120 $\mu$m in pitch length, 40 $\mu$m in width, and 3 mm in depth is formed.

Incidentally, the value 40 $\mu$m of the transverse width is nearly the narrowest value for width which can be obtained by the wire saw processing.

Figure 5:
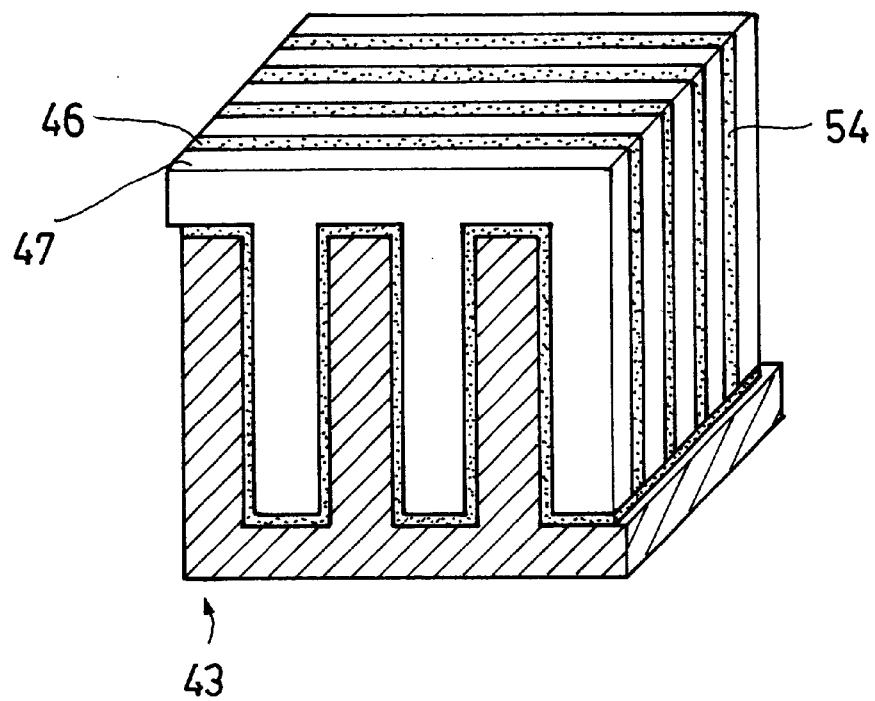
FIG. 5 is a perspective view showing a state in which an insulating resin layer is formed on the integrated grooved block in FIG. 4.

Next to the process in FIG. 4, as shown in FIG. 5, an insulating resin layer 54 is formed by filling an epoxy-based insulating resin in the transverse groove 46 and curing thereof. That is, a mold (not shown) which houses the integrated grooved block 43 is prepared, and after the integrated grooved block 43 is housed in the mold, an insulating resin is filled in the mold. Then, the mold is removed. Then, the upper and lower surfaces of the integrated grooved block 43 covered with the insulating resin layer 54 are removed by grinding or polishing. Thus the finishing process to expose the engaging portion of the transverse grooves 26 with the longitudinal partition walls 27 (the root portion of the longitudinal partition walls 27) of the n-type thermoelectric semiconductor and the p-type thermoelectric semiconductor is carried out, and a thermoelectric device block 53 shown in FIG. 6 is formed.

Figure 6:
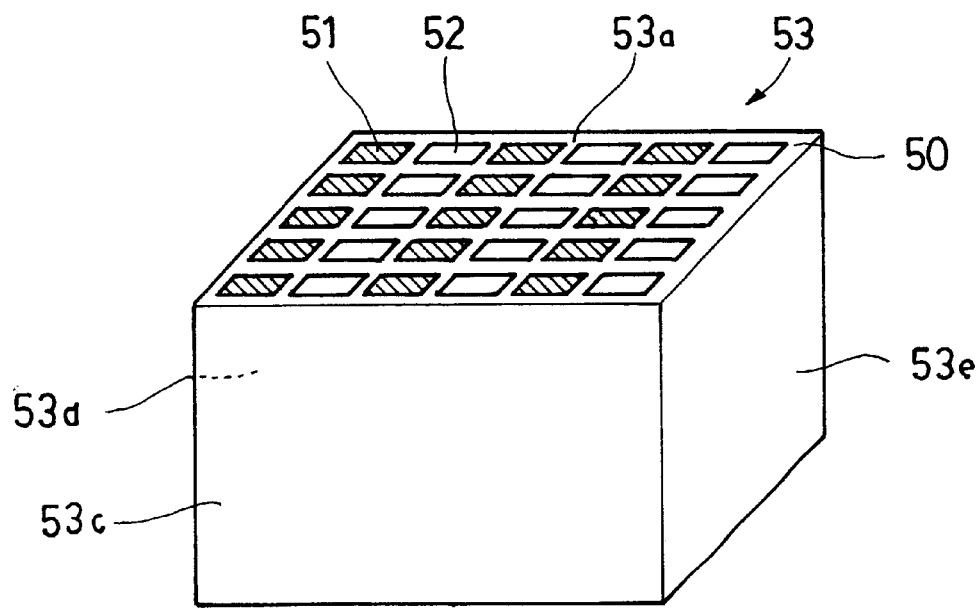
FIG. 6 is a perspective view showing a thermoelectric device block which is obtained by grinding a side face of the integrated grooved block in FIG. 5.

Since the aforementioned adhesive layer 62 shown in FIG. 3 and the insulating resin layer 54 shown in FIG. 5 are layers which have the same function of obtaining electric insulation, both are referred to as combined insulating layer 50 in and after FIG. 6.

Figure 7:
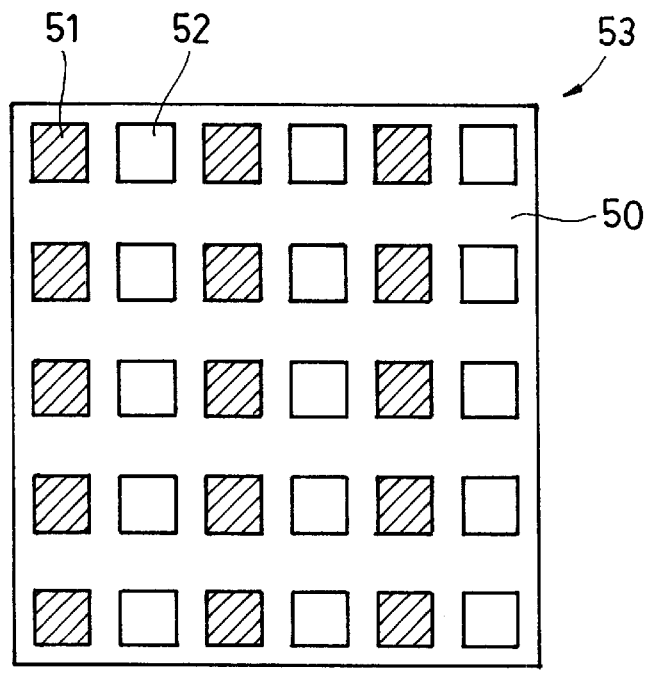
FIG. 7 is a plan view of the thermoelectric block.

A plan view of the thermoelectric device block 53 in this state, which is seen from right above, is shown in FIG. 7. It is noted that the thermoelectric device block 53 in this state has a configuration that each three lines are regularly aligned alternately, in which a line has a set of five pieces, seen from right above, of each n-type bar-shaped devices 51 and p-type bar-shaped devices 52. Both of the horizontal cross section of the n-type bar-shaped device 51 and the p-type bar-shaped devices 52 are rectangles, each having 50 $\mu$m×80 $\mu$m in size. Thus, when a thermoelectric device block 53 is 6 mm×2.4 mm×2 mm in dimension, the block 53 contains each 1000 pieces of the n-type bar-shaped device 51 and the p-type bar-shaped devices 52 having 50 $\mu$m×80 $\mu$m×2000 $\mu$m in size, that is, 1000 pairs of the thermocouples.

Next, each end face of the n-type bar-shaped device 51 and the p-type bar-shaped device 52 is electrically connected to each other with a connection conductor 58$a$ on the upper surface 53$a$ and the lower surface 53$b$ of the thermoelectric device block 53 shown in FIG. 6. This is carried out in a manner such that metallic masking films, made of nickel, having apertures corresponding to each interconnection pattern on the upper surface 53a and the lower surface 53b are placed in the position in relation to each of the upper surface 53a and the lower surface 53b, and fixed in intimate contact, and then a formation of metal film by vapor deposition is carried out.

Then, a pair of terminal conductors 58b which serve as a pad for connecting a lead line for other circuits is formed on one side surface 53c of the thermoelectric device block 53. This is formed in a manner such that metallic masking films having an aperture corresponding to the terminal conductor 58b is placed on the side surface 53c and fixed intimately and a metal vapor oblique deposition process is carried out. The thickness of the vapor deposition film is 100 nm by chromium and 900 nm by copper.

As described above, an interconnection pattern of the interconnection conductor 58a shown in FIG. 8 to connect the n-type bar-shaped device 51 and the p-type bar-shaped devices 52 is formed on the upper surface 53a of the thermoelectric device 53, and a pair of the terminal conductors 58b shown in FIG. 9 are formed on the side surface 53c. Incidentally, since each terminal conductor 58b and the interconnection conductor 58a are formed simultaneously by the vapor deposition, they are connected to each other.

Next, an interconnection process to connect each end face of the n-type bar-shaped device 51 and the p-type bar-shaped devices 52 is carried out on the lower surface 53b of the thermoelectric device block 53 shown in FIG. 6.

That is, a metallic masking film having an aperture corresponding to the interconnection pattern on the lower surface 53b is fixedly positioned at a predetermined position on the lower surface 53b, and a film having the thickness of 100 nm by chromium, 900 nm by copper, is formed by similar vapor deposition process as described above. Thus, the interconnection pattern shown in FIG. 10 is formed on the lower surface 53b with the interconnection conductor 58a.

As described above, when end faces of each n-type bar-shaped device and p-type bar-shaped device are connected with the interconnection conductor 58a, the process is carried out to obtain a plurality of thermocouples which are formed such that the n-type and p-type bar-shaped devices 51, 52 are connected alternately in series. The terminal conductor 58b as well as the interconnection conductor 58a can be electrically connected to each of bar-shaped devices 51a, 52a which are provided on one end portion and the other end portion of plural thermocouples formed here, and lead wires (not shown) can be soldered to each terminal conductor 58b. The lead wire can be used as a lead line for other circuits or other thermoelectric devices.

Through the above interconnection process, 1000 pairs of thermocouples consisting of the n-type bar-shaped device 51 and the p-type bar-shaped devices 52 are electrically connected in series. Since each terminal conductor 58b is electrically connected to each bar-shaped electric devices 51a, 52a which are provided on one end portion and the other end portion of a series of the thermocouples connected in series, voltage generated by 1000 pairs of the thermocouples can be taken out efficiently by connecting the lead lines to each terminal conductor 58b.

In this case, since no interconnection pattern is provided on the side surface 53c on which the terminal conductor 58b is formed, a sufficient space can be ensured, and additionally, only two points are required for the terminal conductor 58b as a pad for a lead line on the space of the side surface 53c. Accordingly, since the terminal conductor 58b is not required to be in an extremely fine structure, but can be formed in some extent of size, the lead line can be easily connected with solder or a conductive adhesive agent.

The electric resistance value of the thermoelectric device containing 1000 pairs of thermocouples prepared by this manufacturing process is 11 kΩ, which is only 10% higher compared with the theoretical electric resistance value of the material only.

The electromotive force is 392 mV/° C., showing the value of 98% in relation to the same theoretical characteristic, which is sufficiently a practical level.

The size of the thermoelectric device thus prepared is 6 mm×2.4mm×2 mm. Since the number of thermocouples required to drive a wrist watch with a temperature difference of 1.3° C., and to obtain voltage of 2.6 V sufficient for charging is 5000 pairs, it is necessary to house five pieces of the thermoelectric devices thus prepared. However, since the cross sectional area of the total five pieces of the thermoelectric devices is only 72 mm$^2$, it can be made sufficiently small to house them in the interior of the wrist watch.

Second Embodiment of the Method of Fabricating the Thermoelectric Device: FIG. 1 to FIG. 10, and FIG. 12 to FIG. 15

Next, the second embodiment of the method of fabricating the thermoelectric device will be explained. The second embodiment of the method of fabrication can produce the similar thermoelectric device to that in the first embodiment of the manufacturing method, but application of a photolithography technology and an etching technology is a different aspect from the first embodiment of the manufacturing method.

First, a thermoelectric device block 53 is formed using a similar method to that explained in the first embodiment of the manufacturing method with reference to FIG. 1 to FIG. 6.

A plan view of the thermoelectric device block 53 seen from right above is shown in FIG. 7.

The thermoelectric device block 53 is the same in the terms of state of alignment of the n-type bar-shaped device 51 and the p-type bar-shaped device 52, size, and shape as those in the first embodiment of the manufacturing method.

Next, interconnection of the n-type bar-shaped device 51 and the p-type bar-shaped device 52 on the upper surface 53a and the lower surface 53b of the thermoelectric device block 53 and connection of a lead line on the side surface 53c are carried out as the following explanation.

A metallic film 14 made of titanium by sputtering and having 1 μm in thickness is formed simultaneously on the upper surface 53a, the lower surface 53b and on the side surface 53c. A cross sectional view of the thermoelectric device block 53 seen from the lateral direction is shown in FIG. 12.

Figure 12:
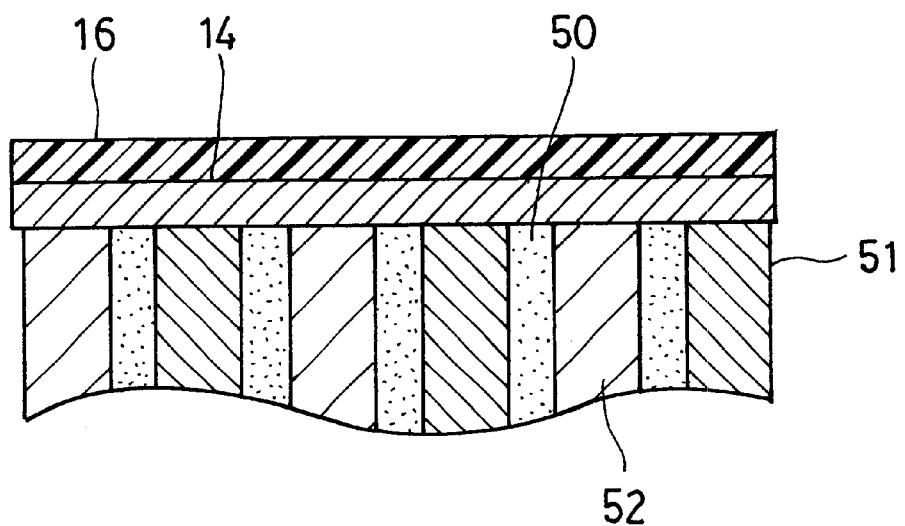
FIG. 12 is a partly omitted cross sectional view of an example of a thermoelectric device block in a manufacturing process of a thermoelectric device.
Figure 13:
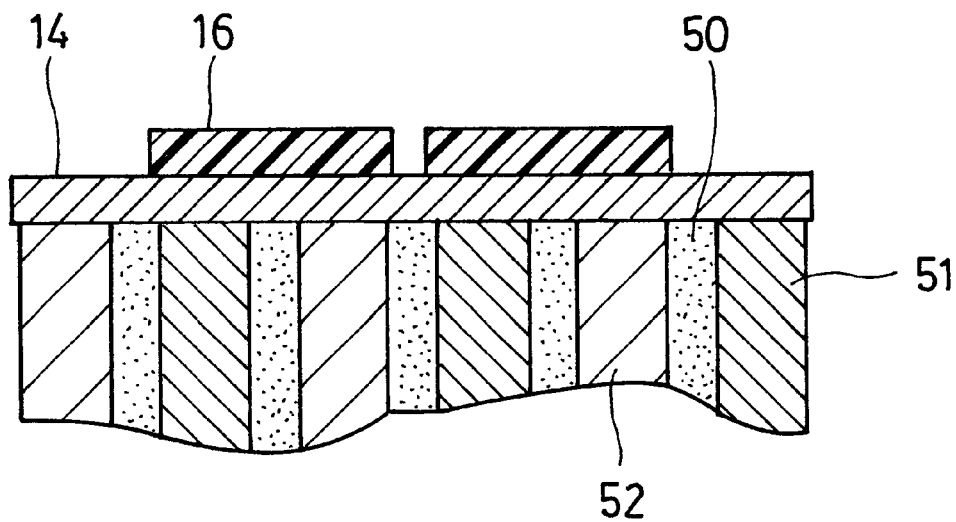
FIG. 13 is a partly omitted cross sectional view of another example thereof.

As shown in FIG. 12, a photosensitive resin film 16 made of a positive-type fluid resist is formed on the metallic film 14. In this case, a photolithography technology consisting of an exposure process to irradiate light onto the photosensitive resin film 16 with a photomask and a development process to dissolve and remove the exposed portion, is performed, thereby the photosensitive resin film 16 is formed only on a portion where the n-type bar-shaped device 51 and the p-type bar-shaped device 52 are connected, as shown in FIG. 13.

At this time, an interconnection pattern on the upper surface 53a is made similar to the interconnection pattern shown in FIG. 8, and in the case of the lower surface 53b, it is made similar to that in FIG. 10, and in the case of the side surface 53c, similar to that in FIG. 9.

Figure 14:
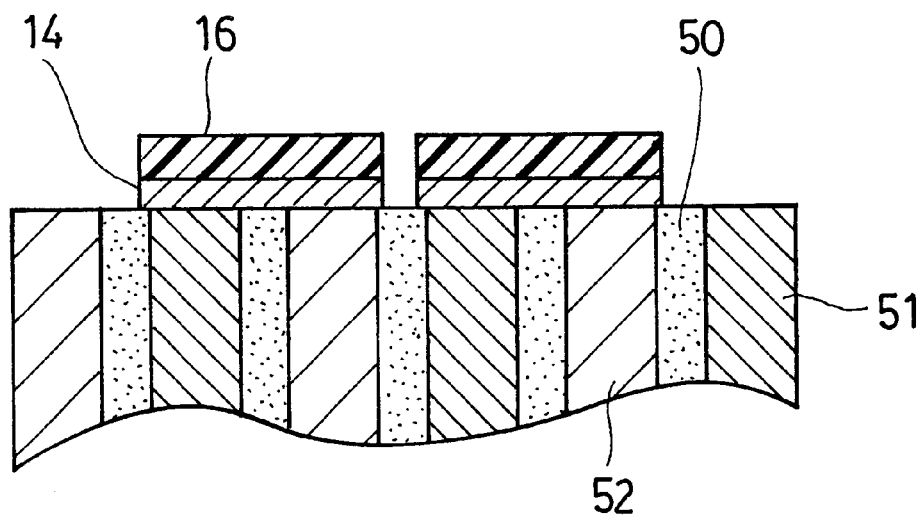
FIG. 14 is a partly omitted cross sectional view of still another example of thereof.

Then, the thermoelectric device block 53 is immersed in 0.5% hydrofluoric acid aqueous solution to solve and remove a metallic film 14 made of titanium on a non-electrode portion which is an opened area of the photosensitive resin film 16, which results in a state shown in a cross sectional view of FIG. 14.

Figure 15:
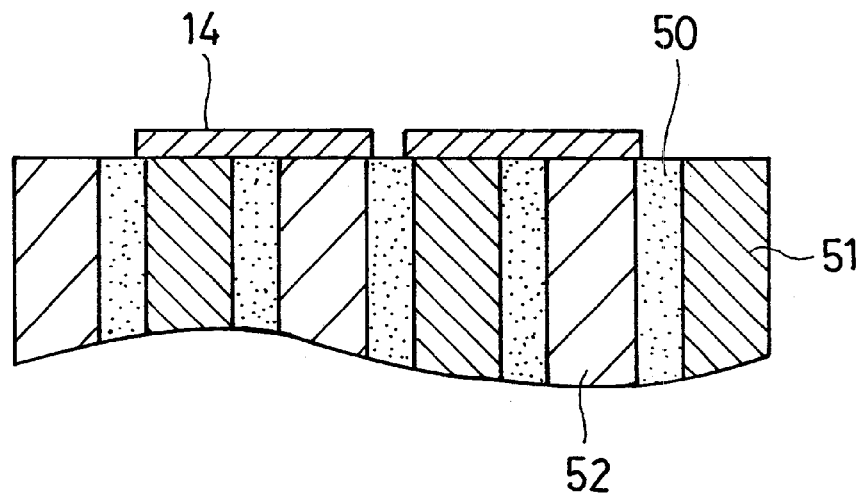
FIG. 15 is a partly omitted cross sectional view of yet another example of thereof.

Then, the photosensitive resin film 16 consisting of a positive-type fluid resist is, as shown in FIG. 15, is immersed in a resist stripper to dissolve and remove the resin film 16. Through this process, the interconnection pattern of the metallic film 14 consisting of titanium becomes the same pattern as shown in FIG. 8 for the upper surface 53a, the same pattern as shown in FIG. 10 for the lower surface 53b, and the same pattern as shown in FIG. 9 for the side surface 53c.

It should be noted that the figure in which the interconnection patterns in FIG. 8 and FIG. 10 are prepared by connecting the n-type bar-shaped device 51 and the p-type bar-shaped device 52 alternately in series to form a series of plural thermocouples is the same as that in the first embodiment of the manufacturing method.

It is also the same aspect as those in the first manufacturing method that the terminal conductor 58b shown in FIG. 9 as well as the interconnection conductor 58a is electrically connected with each bar-shaped devices 51a, 52a provided on one end portion and the other end portion of the thermocouples connected in series, and preferably the number of the thermocouples is as many as possible.

The terminal conductor 58b is the same as in the first embodiment of the manufacturing method in that it can connect a lead wire by soldering, and the lead wire can be used as a lead line for other circuits or other thermoelectric devices. Furthermore, the point that voltage generated by a series of the thermocouples can be taken out by connecting a lead line to the terminal conductor 58b is the same as that in the first embodiment of the manufacturing method, and the point that the connection of the lead line can be easily performed is the same.

The electric resistance value and the electric motive force of the thermoelectric device containing 1000 pairs of the thermocouples prepared by this manufacturing method are nearly the same as those of the thermoelectric device prepared in the first embodiment of the manufacturing method explained before. Since the size and shape are also the same, the cross sectional area required for 5000 pairs of the thermocouples is the same as in the first embodiment of the manufacturing method.

Figure 11:
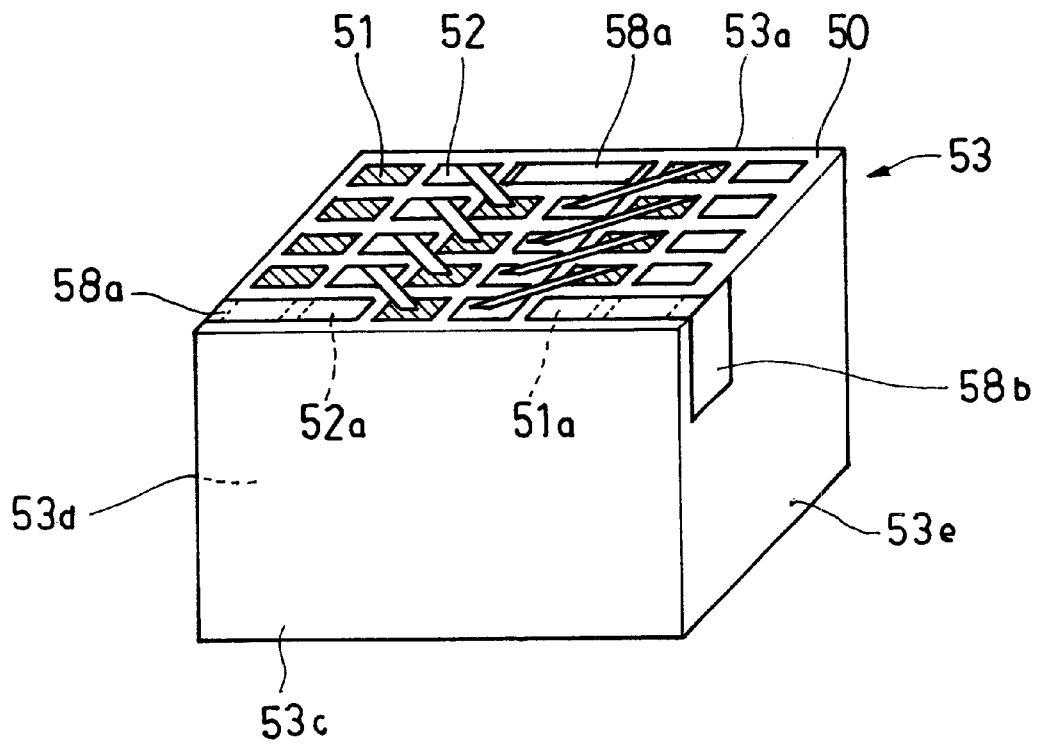
FIG. 11 is a perspective view of a thermoelectric device block on which another interconnection pattern is formed.

Second Embodiment of the Structure: FIG. 8, FIG. 10 and FIG. 11

Next, the second embodiment of the structure of the thermoelectric device will be explained.

A thermoelectric device in this embodiment is different from the thermoelectric device in the first embodiment in that, as shown in FIG. 11, terminal conductors 58b are formed on each one portion of opposing two side surfaces 53d, 53e which exclude the interconnection terminal surfaces. Since other points are the same as those in the first embodiment, the explanation thereof will be omitted.

Each one of the terminal conductors 58b in the present embodiment is formed on the opposing two side surfaces 53d, 53e of the thermoelectric device block 53, and each terminal conductor 58b as well as the interconnection conductor 58a is electrically connected to each bar-shaped devices 51a, 52a corresponding to one end portion and the other end portion of the bar-shaped device consisting of the n-type and p-type bar-shaped devices 51, 52 connected in series. The terminal conductor 58b serves as a pad for a lead line, and can connect to a lead wire (not shown) with solder or a conductive adhesive agent, and the lead wire can be used to connect to another device or another circuit, which is the same as that in the first embodiment.

In the thermoelectric device block 53 according to the present embodiment, in order to form the terminal conductors 58b on the two opposing side surfaces 53d, 53e, it is necessary to perform the vapor deposition twice, but it is desirable because the wiring between each block is made easier, compared with the thermoelectric device block 53 in the first embodiment when plural blocks are connected in series.

Third Embodiment of the Method of Fabricating the Thermoelectric Device: FIG. 1 to FIG. 8, FIG. 10, and FIG. 11

Next, the third embodiment of the method of fabricating the thermoelectric device will be explained.

The present embodiment is different from the first embodiment of the manufacturing method in the respect that a forming process of a terminal conductors 58b is to form one each of the terminal conductors 58b on two opposing side surfaces 53d, 53e, and since other processes are the same as those in the first embodiment of the manufacturing method, the explanation thereof will be omitted.

First, a thermoelectric device block 53 is formed in a similar manner to that in the first embodiment of the manufacturing method, and at the same time interconnection of the n-type and p-type bar-shaped device 51, 52 on the upper surface 53a and the lower surface 53b with the interconnection conductor 58a is carried out. Then terminal conductors 58b which will be a connecting pad for a lead line to other circuits is formed respectively on side surfaces 53d, 53e. The formation of the terminal conductors 58b is performed using a metallic masking film having an aperture corresponding to the terminal conductor 58b. That is, the metal masking films are arranged on each position of the side surfaces 53d, 53e so as to electrically connect to bar-shaped devices 51a, 52a on one end portion and the other end portion of the n-type and p-type bar-shaped devices 51, 52 connected in series, and are intimately fixed. Then, the formation is completed by conducting vapor deposition while the thermoelectric device block 53 is rotated. The film thickness of the vapor deposition is 100 nm by chromium and 900 nm by copper.

While an interconnection pattern is formed on the upper surface 53a and the lower surface 53b with an interconnection conductor 58a as shown in FIG. 8 and FIG. 10, each one of the terminal conductors 58b which will be a pad for a lead line as shown in FIG. 11 is formed on the side surface 53d, 53e by the vapor deposition. At this time, the interconnection conductor 58a on the upper surface 53a and the terminal conductors 58b on the side surfaces 53d, 53e are simultaneously formed by the vapor deposition to connect with each other as shown in FIG. 11.

The relation between the interconnection patterns in FIG. 8 and FIG. 10 is the same as that in the first embodiment in such that the n-type bar-shaped devices 51 and the p-type bar-shaped devices are alternately connected in series to form a plurality of thermocouples. It is also the same as in the first embodiment that the interconnection conductor 58a and the terminal conductors 58b are electrically connected respectively to the bar-shaped devices 51a, 52a on one end portion and the other end portion of plural thermocouples connected in series so that as many as thermocouples can be obtained. In addition, the aspect in which lead wires are connected to the terminal conductors on the side surfaces 53d, 53e by soldering and the lead wire is used for a lead line to other circuits and other thermoelectric power generating devices is the same as in the first embodiment. Thus, since no interconnection pattern is required on the side surfaces 53d, 53e, a sufficient space is secured, and since only one each of the pads for the lead line is required on each space having a surface area of 2.4 mm×2 mm which is the dimension of the side surfaces 53d, 53e, the pads can be formed with dimension of some extent. Therefore, the connection of the lead wire can be easily carried out, which is also the same as that in the first embodiment.

Incidentally, the electric resistance value and the electromotive force of the thermoelectric device containing 1000 pairs of thermocouples prepared by the above described manufacturing method are nearly the same as those prepared by the first embodiment of the manufacturing method. Since the dimension and the shape are also the same, the total of five cross sectional areas necessary for 5000 pairs of the thermocouples is the same as the area in the first embodiment of the manufacturing method.

Figure 17:
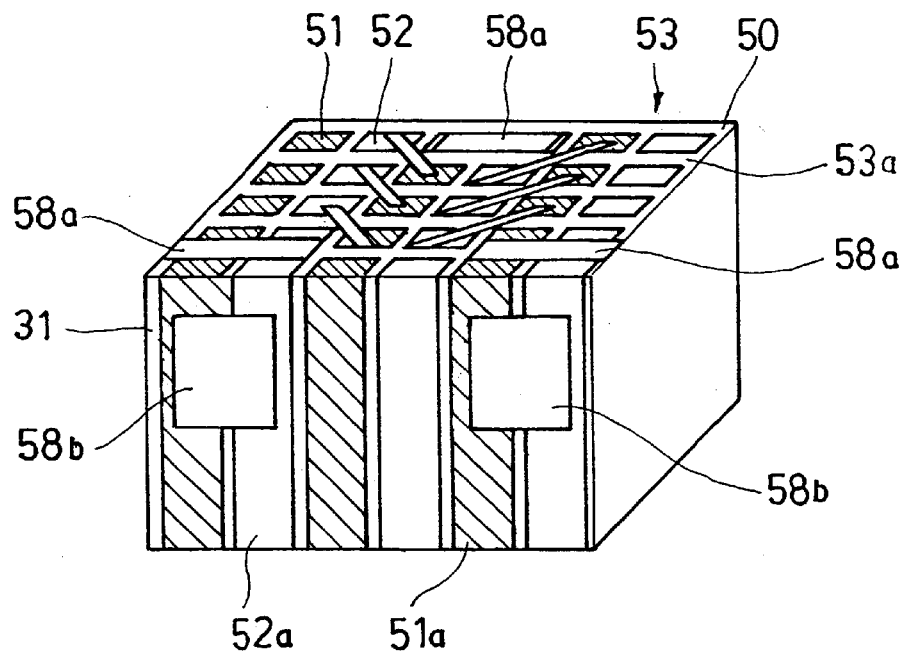
FIG. 17 is a perspective view showing another modified example of the thermoelectric device block on which an interconnection pattern is formed.

Third Embodiment of the Structure: FIG. 8, FIG. 10, and FIG. 17

Next, the third embodiment of the structure will be explained. The thermoelectric device in the present embodiment differs from the thermoelectric device in the first embodiment in that, as shown in FIG. 17, each one portion of the n-type and p-type bar-shaped devices 51a, 52a at least on one end portion and the other end portion of the n-type and p-type bar-shaped devices 51, 52 connected in series is exposed from one side surface of the thermoelectric device block 53 so as to make the terminal conductor 58b contact with the n-type bar-shaped device 51a or the p-type bar-shaped device 52a so that a pair of terminal conductor 58b can be formed.

The interconnection conductors 58a are arranged in a manner as shown in FIG. 8 for the upper surface 53a and in FIG. 10 for the lower surface 53b, and in order to obtain as many thermocouples as possible, terminal conductor 58b is electrically connected respectively to the bar-shaped devices 51a, 52a corresponding to one end portion and the other end portion of the n-type and p-type bar-shaped devices 51, 52 connected in series, which is, of course, the same as that in the first embodiment.

Incidentally, what is in the drawing has a structure in which each terminal conductor 58b is not connected to the interconnection conductor 58a, but both conductors may connect with each other while changing the position for the formation.

Fourth Embodiment of the Method of Fabricating the Thermoelectric Device: FIG. 1 to FIG. 8, FIG. 10, FIG. 16, and FIG. 17

Next, the fourth embodiment of the method of fabricating the thermoelectric device will be explained. The present embodiment differs from the first embodiment of the manufacturing method in that, before the formation of a terminal conductor 58b, a portion of the n-type and p-type bar-shaped devices 51, 52 connected in series is exposed from a side surface 31 so that a process to form a terminal conductor 58b on the exposed surface is provided.

Figure 16:
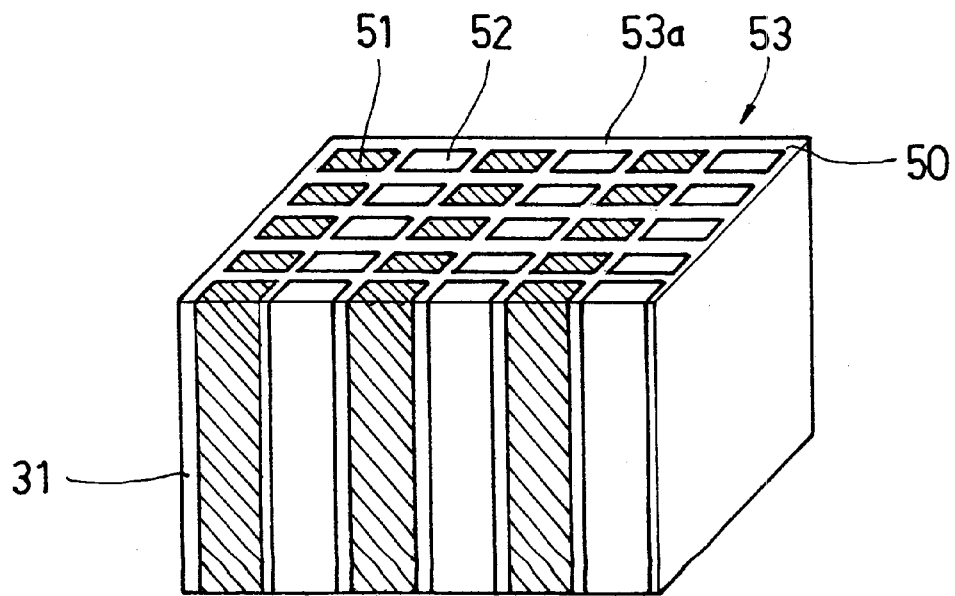
FIG. 16 is a perspective view showing a modified example of the thermoelectric device block.

In this process, a side surface 53c of the thermoelectric device block 53 formed in the same manner as that in the first embodiment is ground or polished to expose, as shown in FIG. 16, each bar-shaped device so as to include each of the bar-shaped devices 51a, 52a on one end portion and the other end portion of plural thermocouples consisting of the n-type and p-type bar-shaped devices 51, 52 connected in series, to thereby form the side surface 31. In addition, the process can be performed at the time when the upper surface and the lower surface of the thermoelectric device block 53 are ground or polished in the first embodiment of the manufacturing method to be performed simultaneously with the formation of the thermoelectric device block 53.

Then, each end face of the n-type bar-shaped devices 51 and the p-type bar-shaped devices 52 is electrically connected to form the interconnection pattern as shown in FIG. 8 and FIG. 10 on the upper surface 53a and on the lower surface 53b in the same manner as that in the first embodiment of the manufacturing method, and a pair of the terminal conductors 58b are formed so as to contact across the n-type and p-type bar-shaped devices 51a, 52a on one end portion and the other end portion on the side surface 31. This is performed by making a metal film having an aperture corresponding to the terminal conductors 58b as shown in FIG. 17 an intimate contact with the side surface 31 and fixing with each other and by forming a vapor deposition film as described above.

In the present embodiment, the vapor deposition film is formed as a pad for a lead line, but the n-type bar-shaped devices 51 and the p-type bar-shaped devices 52 exposed on the side surface 31 can be directly soldered without forming the vapor deposition film. However, since the bar-shaped device is made of BiTeSb-based material, solder is also required to be of the same sort of material. Therefore, it is desirable to carry out the vapor deposition to form a metal film, so that conventional lead-based material can be used as the solder.

The terminal conductors 58b are formed on the side surface 31 by the above-described process, but since wiring pattern is not formed necessary on the side surface 31, there is a sufficient space. In addition, since only two pads for a lead line need to be provided on the side surface having a dimension of 6 mm×2 mm, the pad can be formed with dimensions of a certain extent. Consequently, the lead lines can be easily connected with solder or a conductive adhesive agent. And since the pad for a lead line is provided through a portion of the bar-shaped device, a reliable connection can be ensured without performing simultaneous vapor deposition on the upper surface and the lower surface of the thermoelectric device block 53.

Incidentally, since other aspects are the same as those in the first embodiment, the explanation thereof is omitted.

Figure 19:
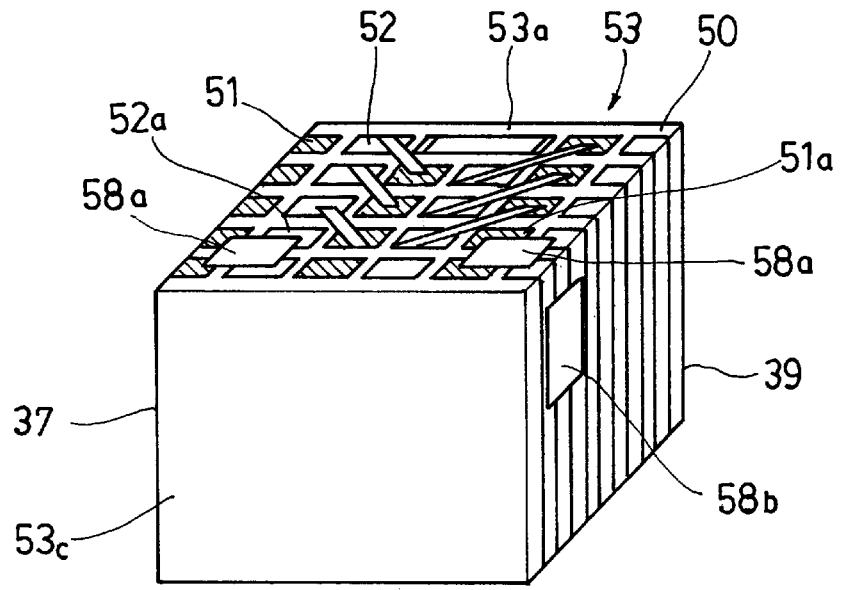
FIG. 19 is a perspective view showing a state in which an interconnection pattern is formed on the thermoelectric device block in FIG. 18.
Figure 20:
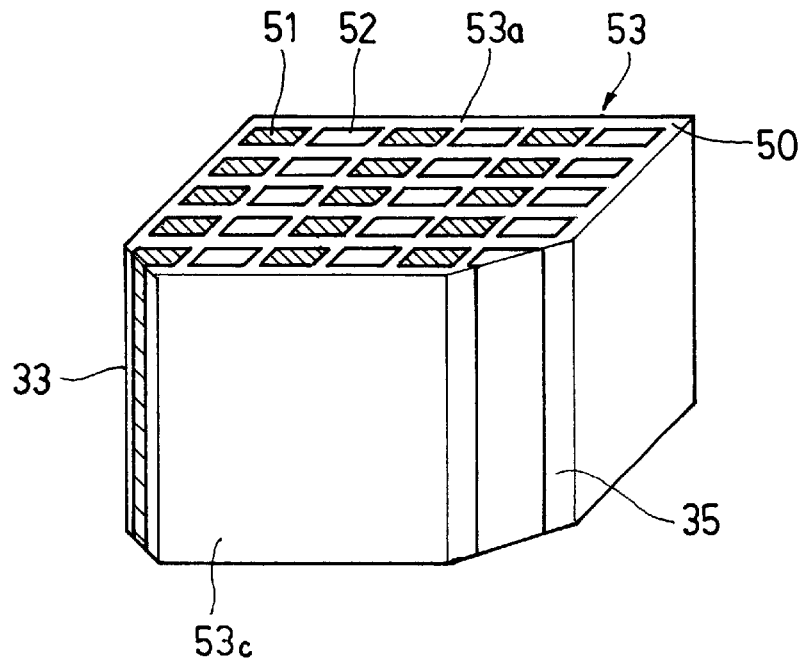
FIG. 20 is a perspective view showing yet another modified example of the thermoelectric device block.

Fourth Embodiment of the Structure: FIG. 8, FIG. 10, and FIG. 19

Next, the fourth embodiment of the structure will be explained. Comparing to the first embodiment, a thermoelectric device according to the present embodiment is different in that, as shown in FIG. 19, each of bar-shaped devices 51a, 52a on at least one end portion and the other end portion out of an n-type and p-type bar-shaped devices 51, 52 connected in series is exposed on one and the other portion of the opposing two side surfaces 37, 39 excluding interconnection terminal surfaces 53a, 53b, and the structure is formed by bringing each terminal conductor 58b contact with each of the bar-shaped device 51a, 52a on one end portion and the other end portion on the exposed surface.

Though the terminal conductors 58b formed on two side surfaces 37, 39 are not connected to the interconnection conductors 58a in the embodiment shown in the drawing, it can be possible to connect with each other.

Incidentally, since other aspects are the same as those in the first embodiment, the explanation thereof will be omitted.

Fifth Embodiment of the Method of Fabricating the Thermoelectric Device: FIG. 1 to FIG. 8, FIG. 10, FIG. 18 and FIG. 19

Next, the fifth embodiment of the method of fabricating the thermoelectric device will be explained. The present embodiment differs from the first embodiment in the following aspects. That is, before the process of forming the terminal conductor 58b, provided is a process to expose each of the bar-shaped devices 51a, 52a which are at least on one end portion and the other end portion out of the n-type and p-type bar-shaped devices 51, 52 connected in series on one and the other of opposing two side surfaces 37, 39, and the forming process of the terminal conductor 58b is such that a pair of the terminal conductor 58b is connected to each of the bar-shaped devices 51a, 52a which are on one end portion and the other end portion, on each exposed surface.

Figure 18:
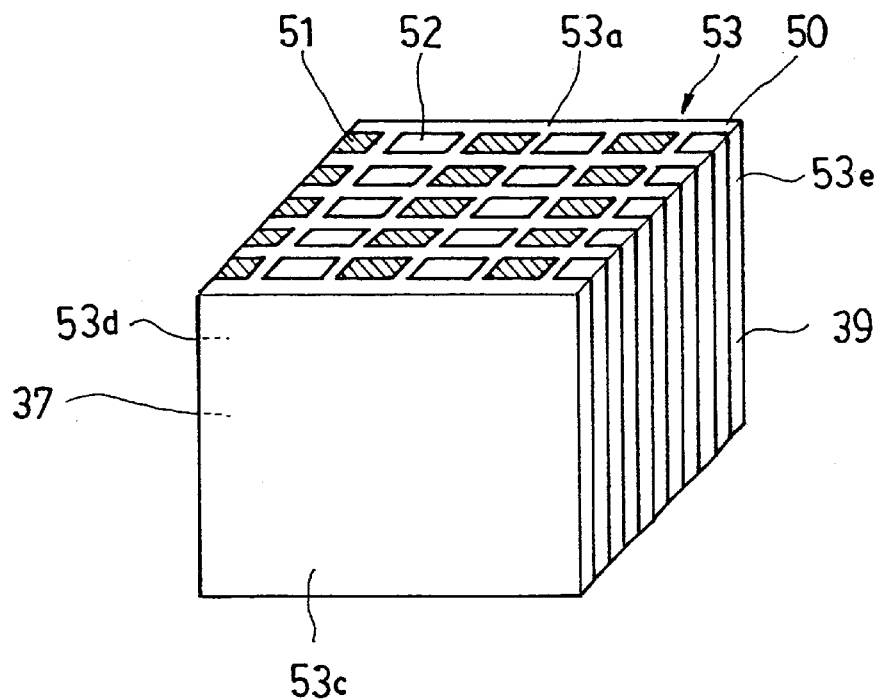
FIG. 18 is a perspective view showing still another modified example of the thermoelectric device.

The process of forming the terminal conductor 58b is carried out in a manner such that new side surfaces 37, 39 are formed by grinding or polishing the opposing two side surfaces 53d, 53e so that each one portion of the n-type bar-shaped devices 51 and p-type bar-shaped devices 52 are exposed as shown in FIG. 18, and a predetermined metal masking films are respectively brought to an intimate contact with these two side surfaces and are fixed to form vapor deposition films respectively. When carrying out the polishing or the like on the upper and lower surface of the thermoelectric device block 53 in the first embodiment of the method of fabrication, a portion of the n-type and p-type bar-shaped devices can be exposed by polishing or the like the side surfaces 53d, 53e, or the upper and lower surfaces of the thermoelectric device block 53 can be polished after the above described exposure process.

In the present embodiment, vapor deposition films are formed as a pad for a lead line, but the n-type and p-type bar-shaped devices exposed on the side surfaces 37, 39 can be directly soldered without forming the vapor deposition films. However, since the bar-shaped devices are made of BiTeSb-based material, the solder needs to be of the same sort. Therefore, it is desirable to form a metal film so that the soldering can be performed with a conventional lead-based material.

Since interconnection patterns are not formed on the side surfaces 37, 39, which ensures a sufficient space, and only one portion each is formed to provide the pad for a lead line on the side surface of the thermoelectric device block having 2.4 mm×2 mm in dimension, the pad can be formed in dimensions of a certain extent. Therefore, the lead line can be easily connected by soldering and the like. In addition, since the pad for a lead line is formed through a portion of the bar-shaped devices, a reliable connection can be secured without conducting a simultaneous vapor deposition of the upper and lower surfaces of the thermoelectric device block 53. When the terminal conductors 58b are formed, the terminal conductor 58b may be connected to the interconnection conductor 58a. Incidentally, since other aspects are the same as those in the first embodiment, the explanation thereof will be omitted.

Figure 21:
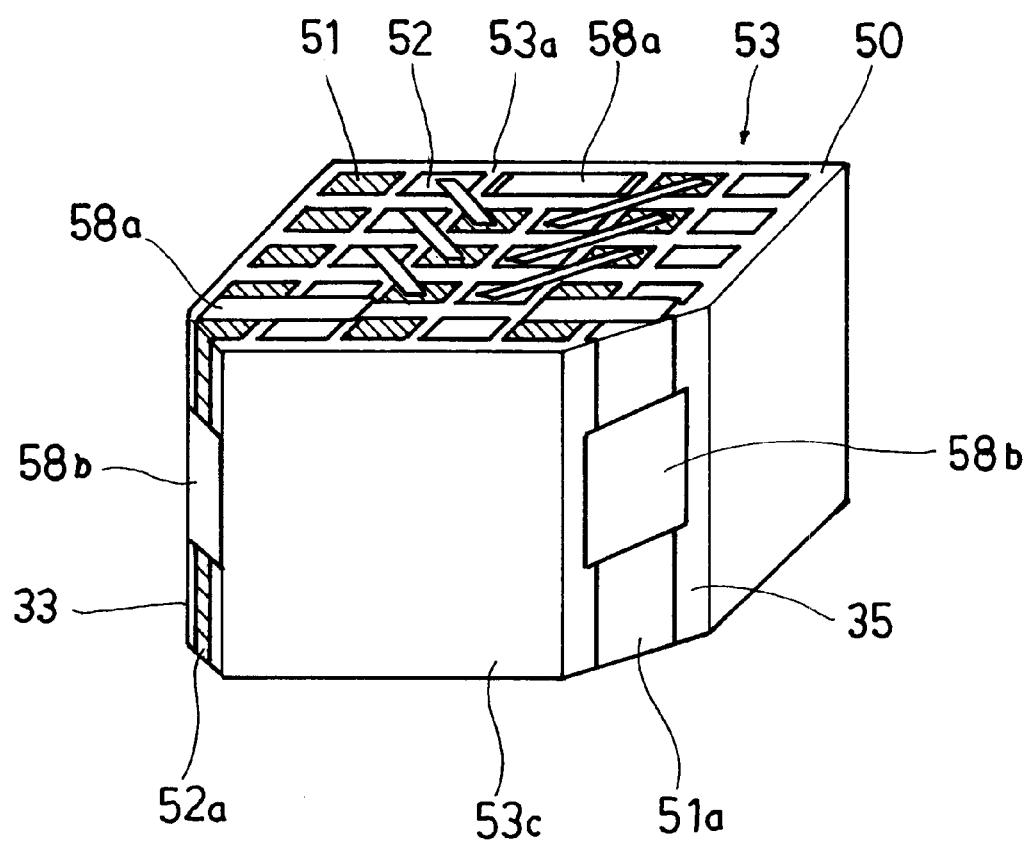
FIG. 21 is a perspective view showing a state in which an interconnection pattern is formed on the thermoelectric device block in FIG. 20.

Fifth Embodiment of the Structure: FIG. 8, FIG. 10, and FIG. 21

The fifth embodiment of the structure will be explained next. The thermoelectric device in the present embodiment differs from the thermoelectric device in the first embodiment in that, as shown in FIG. 21, the structure of the thermoelectric device block 53 is as follows. That is, each of chamfered oblique surfaces 33, 35 are formed between a side surface 53c excluding the interconnecting end face and other side surfaces adjacent to both ends of the side surface 53c, and each one portion of the bar-shaped devices 51a, 52a at least on one end portion and the other end portion of the n-type bar-shaped devices connected in series is exposed on each chamfered oblique surface 33, 35.

Incidentally, other aspects are the same as those in the first embodiment, the explanation thereof will be omitted.

Sixth Embodiment of the Method of Fabricating the Thermoelectric Device: FIG. 1 to FIG. 8, FIG. 10, FIG. 20 and FIG. 21

The sixth embodiment of the method of fabricating the thermoelectric device will be explained next. Compared to the first embodiment, the present embodiment differs in that another process is inserted before the process to form the terminal conductors 58b, which is formed as follows.

That is, before the step of forming the terminal conductors 58b, the step of forming chamfered oblique surfaces 33, 35 respectively whereby to grind or polish two corner portions formed between the side surface 53c of the thermoelectric device block 53 and the side surfaces adjacent to the above-described both end, and the step of exposing portion of the bar-shaped device 51a, 52a which are at least on one end portion and the other end portion of the n-type and p-type bar-shaped devices 51, 52 connected in series, on the chamfered oblique surfaces 33, 35, are carried out. Then, following to these steps, a predetermined metal masking film is intimately contacted to the exposed portion of the chamfered oblique surfaces 33, 35, and fixed to form a vapor deposition film, through which one and the other of a pair of the terminal conductor 58b contact each bar-shaped device 51a, 52a.

The method of the vapor deposition and the vapor deposition film are the same as those in the case of the side surface 53c in the first embodiment of the manufacturing method. However, when carrying out the vapor desposition, the side surface 53c is covered with a mask having no aperture.

In this embodiment, the vapor deposition film is formed as a pad for a lead line, but without forming of the vapor deposition film, the n-type bar-shaped device 51a or the p-type bar-shaped device 52a exposed on the side surfaces 33, 35 can be directly soldered. However, the deposition of the metallic film is desirable because of the same reason as in the case of the fourth embodiment of the manufacturing method.

When manufactured through this method, interconnection pattern is not formed on the side surface 53c, which ensures a sufficient space. In addition, since the shape of the thermoelectric device block 53 is a cuboid from which two corners are cut away, a compact thermoelectric device can be obtained without having a larger size than the initial cuboid due to a projection and the like made by soldering of a lead line.

Since the pad for a lead line is provided through a portion of the bar-shaped device, a reliable connection can be ensured without a simultaneous vapor deposition of the upper and lower surfaces of the thermoelectric device block 53.

Incidentally, since other aspects are the same as those in the first embodiment, the explanation thereof will be omitted.

Next, as for a thermoelectric device to provide a terminal conductor on other surfaces excluding the upper surface 53a and the lower surface 53b which serve as a interconnecting end face, another interconnecting pattern structure of the interconnection conductor 58a of the n-type bar-shaped devices 51 and the p-type bar-shaped devices 52 will be explained.

Figure 22:
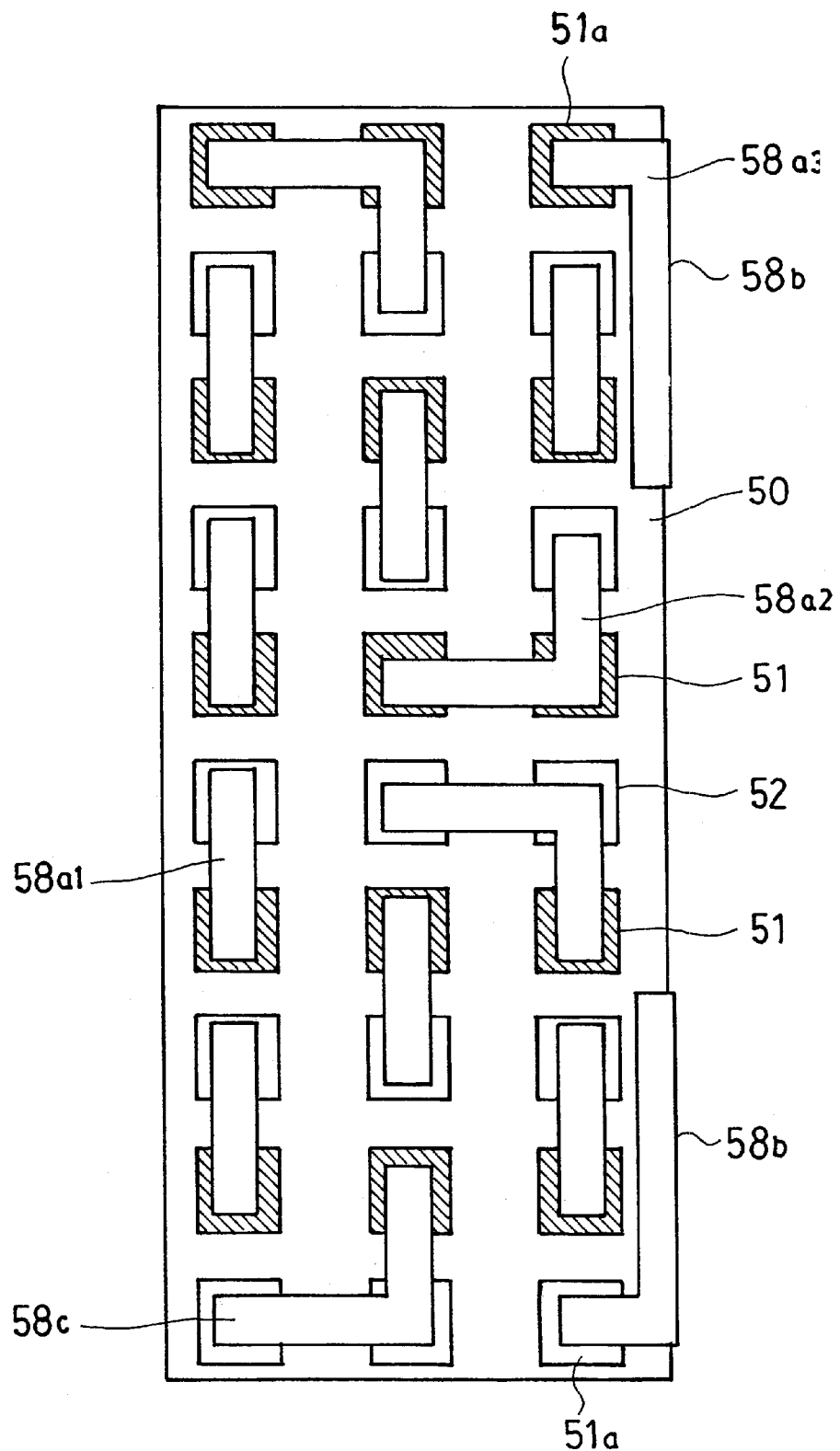
FIG. 22 to FIG. 25 are plane views showing modified examples of interconnection patterns of the thermoelectric device.
Figure 23:
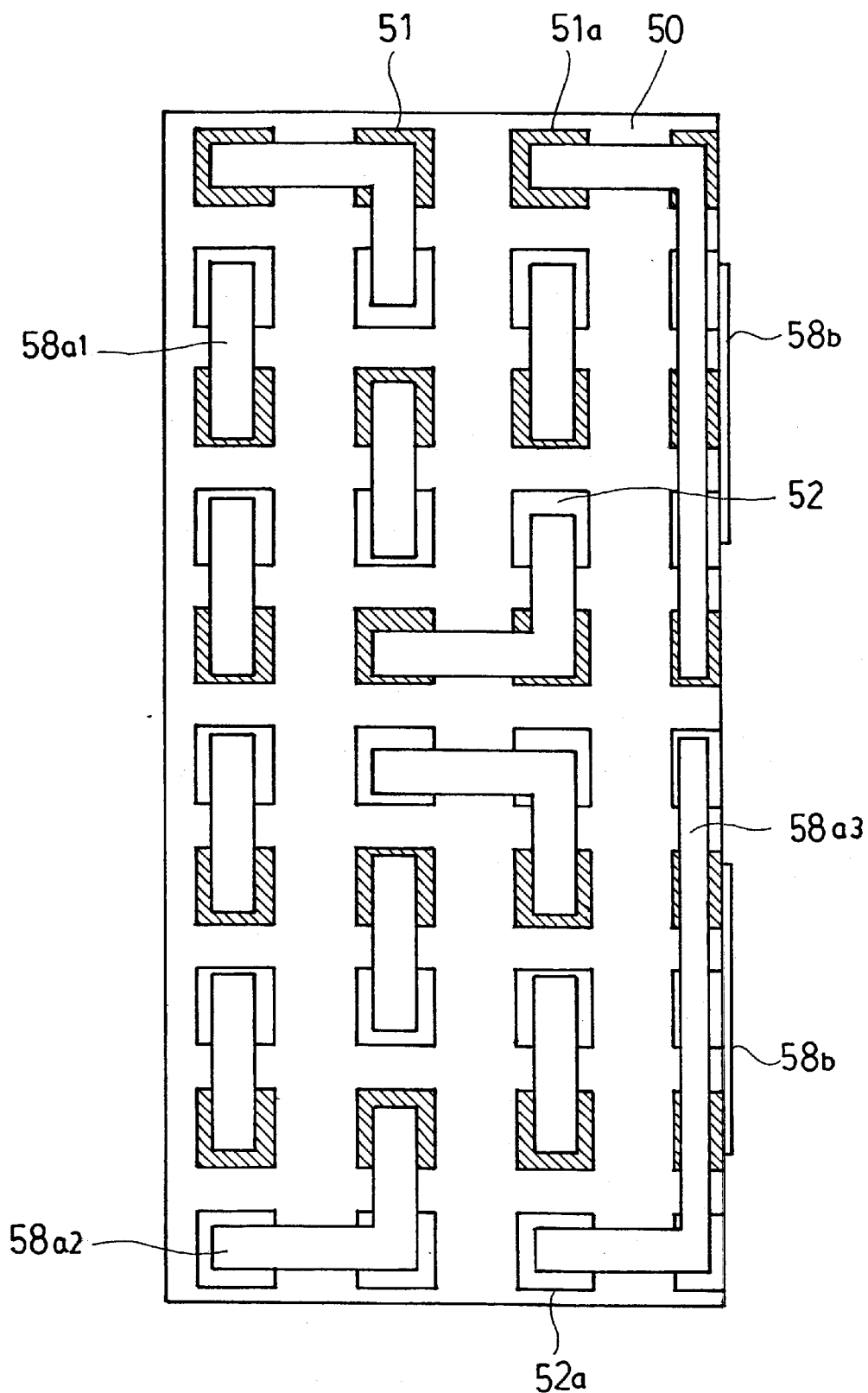

FIG. 22 shows a modified embodiment of the interconnection pattern of the upper surface 53a shown in FIG. 9 and FIG. 23 shows a modified embodiment of the interconnecting pattern of the upper surface 53a shown in FIG. 17, respectively. As shown in drawings, the thermoelectric device block 53 provides plural rows (three rows in FIG. 22)

of the device row in which the n-type bar-shaped devices 51 and the p-type bar-shaped devices 52 alternately aligned. The interconnection conductor 58a in FIG. 22 consists of three types of the interconnection conductors 58a1, 58a2, and 58a3.

The interconnection conductor 58a1 connects each end face of the adjacent n-type bar-shaped devices 51 and p-type bar-shaped devices 52 contained in the same device row in the parallel direction in each device row, and has a rectangular shape when seen from above. The interconnection conductor 58a2 is to transfer the interconnection to the adjacent row, connecting each end face of the n-type bar-shaped devices 51 and p-type bar-shaped devices 52 striding across the adjacent device row, and has a L-letter shape when seen from above. The interconnection conductor 58a3 has a pair of L-letter shapes when seen from above, which are connected to each of the end faces of bar-shaped devices 51a, 52a at least on one end portion and the other end portion of the n-type and p-type bar-shaped devices 51, 52 connected in series by the interconnection conductor 58a1 and the interconnection conductor 58a2.

In the present embodiment, a pair of terminal conductors 58b which is formed on the side surface 53c, is electrically connected respectively to the interconnection conductor 58a3 on the edge portion of the upper surface 53a. Accordingly, the n-type and p-type bar-shaped devices 51, 52 are connected in series by the interconnection conductor 58a1 and the interconnection conductor 58a2, and the interconnection conductor 58a3 is connected to each end face of bar-shaped devices 51a, 52a provided on one end face and the other end face, and in addition, the terminal conductor 58b is connected to each interconnection conductor 58a3, so that voltage can be effectively taken out in one side surface by connecting a desired lead wire to each terminal conductor 58b. The terminal conductors 58b in the present embodiment are formed on one side surface 53c, but the terminal conductors 58b can be formed to two opposing side surfaces respectively adjacent to the side surface 53c.

Next, the interconnection pattern shown in FIG. 23 will be explained. The pattern has a plurality of device rows (four rows) similar to that in FIG. 22, consisting of three interconnection conductors 58a which are 58a1, 58a2, and 58a3. Since the interconnection conductors 58a1, 58a2 are the same as those in FIG. 22, the explanation thereof will be omitted. The interconnection conductor 58a3 has a pair of L-letter shapes when seen from above, which is connected to each end face of the first bar-shaped device group containing the bar-shaped device 51a at least on one end portion, and each end face of the second bar-shaped device group containing the bar-shaped device 52a on the other end portion of the n-type and p-type bar-shaped device 51, 52 connected in series by the interconnection conductor 58a1 and the interconnection conductor 58a2. Each of a pair of terminal conductors 58b is formed on the exposed surface of the bar-shaped device so as to contact the bar-shaped device 51a contained in the first bar-shaped device group, and the bar-shaped device 52a contained in the second bar-shaped device group, with the bar-shaped device exposed on the side surface 53c of the thermoelectric device block 3. In the case of the present embodiment, by connecting a desired lead wire to each terminal conductor 58b similar to the case in FIG. 22, voltage can be effectively taken out on one side surface.

The terminal conductor 58b may be formed one each on two opposing side surfaces adjacent to the side surface 53c, or as shown in the drawing, not only the case of not contacting the interconnection conductor 58a3, but can be formed so as to make contact therewith.

Figure 24:
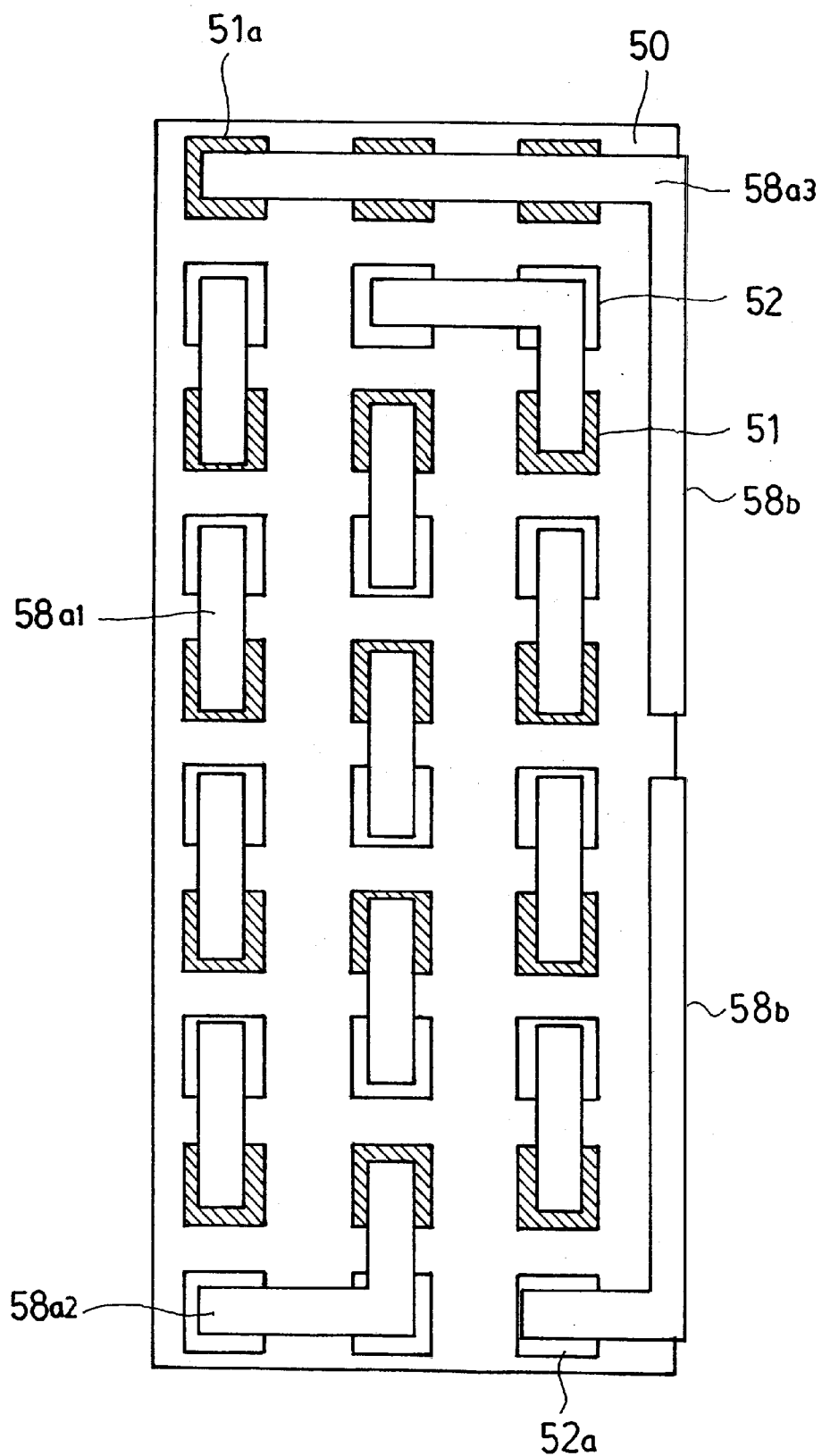
Figure 25:
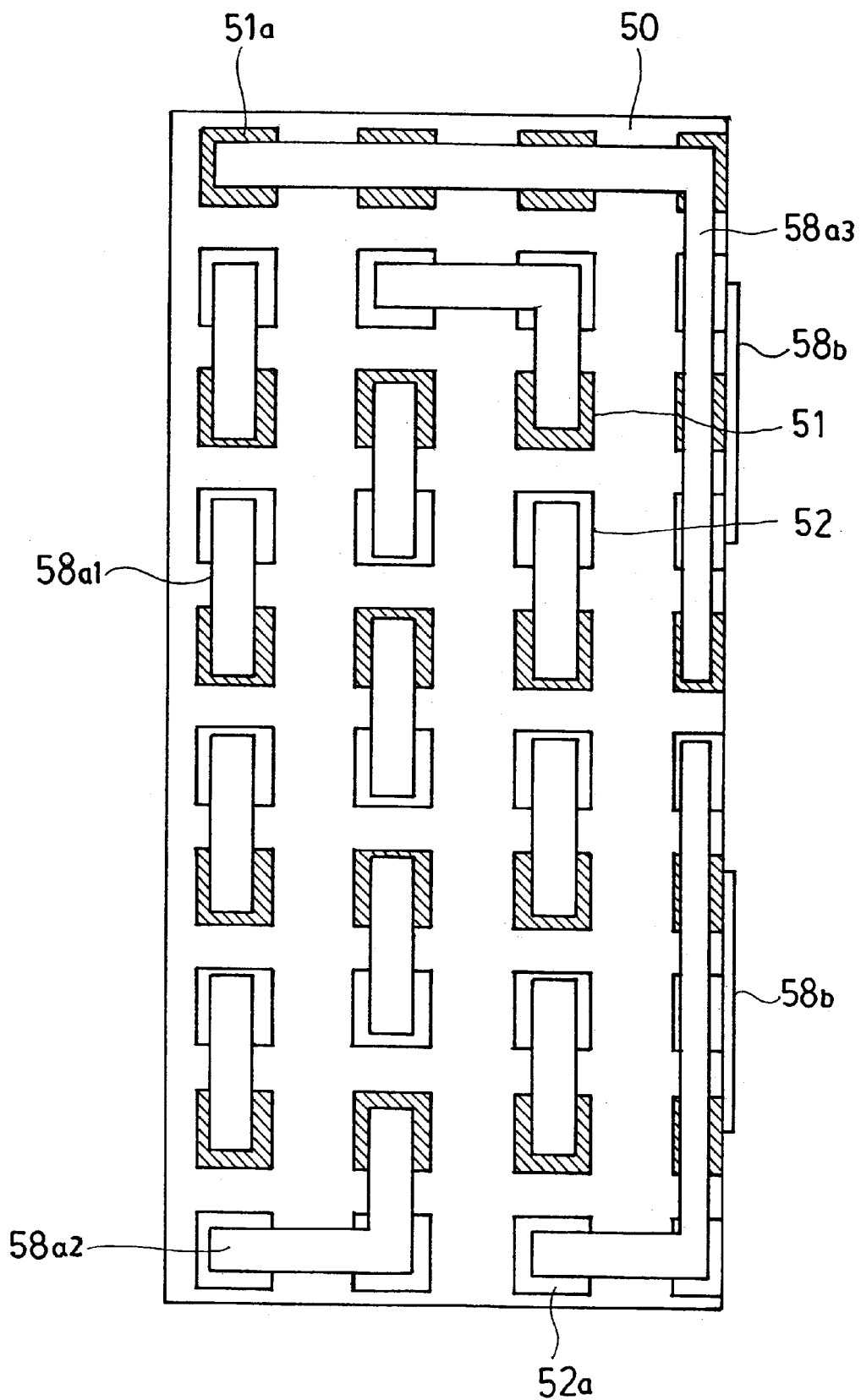

Other interconnection patterns are shown in FIG. 24 and FIG. 25. Both patterns have a plurality of device rows (three rows in FIG. 24, and four rows in FIG. 25), and the interconnection conductor 58a consists of three interconnection conductor 58a, that is, 58a1, 58a2, and 58a3. Incidentally, FIG. 24 corresponds to the modified embodiment in FIG. 22, and FIG. 25 corresponds to the modified embodiment in FIG. 23. FIG. 24 and FIG. 25 differ from FIG. 22 and FIG. 23 is that each of the bar-shaped devices 51a, 52a provided on one end portion and the other end portion of the n-type and p-type bar-shaped devices 51, 52 connected in series is disposed near the diagonal positions of the thermoelectric device block 3. Even in these cases, by connecting a desired lead wire to each terminal conductor 58b, voltage can be effectively taken out from one side surface. As for each terminal conductor 58b, in the case shown in FIG. 24, both of the terminal conductors are connected to the interconnection conductor 58a3 on the side surface 53c, but each one can be formed on two opposing side surfaces adjacent to the side surface 53c. In the case shown in FIG. 25, the terminal conductor is formed without contacting the interconnection conductor 58a3, but can be formed in contact with the interconnection conductor 58a3.

The interconnection patterns shown in FIG. 24 and FIG. 25 have been long considered, but since each of the bar-shaped devices 51a, 52a on one end portion and the other end portion of the n-type bar-shaped device 51 and the p-type bar-shaped device 52 alternately connected in series in this interconnection pattern is disposed near the diagonal position of the thermoelectric device block 3, the lead wire can be taken out from only the two side surfaces.

Then, in the present invention, as shown in the drawings, two interconnection conductors 58a3 in the final position of the interconnection to connect with a pair of terminal conductors 58b are made in an asymmetrical shape so as to make contact with each of the bar-shaped devices 51a, 52a near the diagonal position so that the drawing out from one side surface 53c is made possible.

The interconnection pattern shown in FIG. 22 to FIG. 25, differing from the above described interconnection pattern, has no pattern that obliquely connects between the bar-shaped device rows. Therefore, even when distance between the bar-shaped devices becomes small accompanying by micronizing the thermoelectric device, the interconnection pattern does not become too fine, which makes it useful.

It should be noted that a conductor having a L-letter shape is used as an example to transfer the interconnection to the adjacent row in this explanation, but since the essential function is to make contact with the adjacent row, any pattern that can perform the function (to connect crossing over the adjacent n-type bar-shaped device 51 and the p-type bar-shaped device 52) may be acceptable, even if it is in a square or a triangle shape, other than a L-letter shape.

INDUSTRIAL APPLICABILITY

As clear from the above explanation, a thermoelectric device of the present invention can efficiently take out voltage in spite of its minute size. According to a method of fabrication of the present invention, the thermoelectric device takes out a lead line from a side surface on which electrode pattern is not formed, so that the lead line can be connected with an easy operation.

In addition, since a new section is not required for taking out the lead line, a small space can be utilized more efficiently, and the thermocouples can be housed in high density. Accordingly, it can be installed into a fine device such as a wrist watch.

Using the thermoelectric device of the present invention, electric generation by temperature difference will maybe utilized in a portable electronics device such as a wrist watch.

Additionally, a small high performance cooling apparatus can be prepared using the thermoelectric device, which is extremely useful as a portable refrigerator or a local cooling apparatus for a laser or an integrated circuit.

What is claimed is:

1. A thermoelectric device comprising:

a thermoelectric device block having two interconnecting end faces on which a plurality of n-type bar-shaped devices consisting of n-type thermoelectric semiconductors and a plurality of p-type bar-shaped devices consisting of p-type thermoelectric semiconductors are regularly disposed through an insulating layer to alternately align each n-type bar-shaped device rows and p-type bar-shaped device rows and fixed, and both end faces of each of said n-type bar-shaped devices and p-type bar-shaped devices are exposed;

an interconnection conductor connecting each end face of said n-type bar-shaped devices and p-type bar-shaped devices on said each interconnecting end face of said thermoelectric device block to connect said n-type bar-shaped devices and p-type bar-shaped devices in series; and a pair of terminal conductors consisting of metal film provided on a surface excluding said interconnecting end faces of said thermoelectric device block, and electrically connected each bar-shaped device at least on one end portion and the other end portion of the n-type bar-shaped devices and p-type bar-shaped devices connected in series;

a chamfered oblique surface is formed between one surface excluding said interconnecting end face of said thermoelectric device block and each surface adjacent to both ends of the surface, and the bar-shaped devices at least on one end portion and the other end portion of said n-type bar-shaped devices and p-type bar-shaped devices connected in series are respectively exposed on one and said the other chamfered oblique surface, one and the other of said pair of terminal conductors are made contact with and provided on the exposed surface of said one and the other chamfered oblique surfaces of each bar-shaped device.

* * * * *